United States Patent
Morita et al.

(10) Patent No.: US 6,663,708 B1
(45) Date of Patent: Dec. 16, 2003

(54) SILICON WAFER, AND MANUFACTURING METHOD AND HEAT TREATMENT METHOD OF THE SAME

(75) Inventors: Etsuro Morita, Tokyo (JP); Takaaki Shiota, Tokyo (JP); Yoshihisa Nonogaki, Tokyo (JP); Yoshinobu Nakada, Tokyo (JP); Hisashi Furuya, Tokyo (JP); Hiroshi Koya, Tokyo (JP); Jun Furukawa, Saitama (JP); Hideo Tanaka, Saitama (JP); Yuji Nakata, Saitama (JP)

(73) Assignee: Mitsubishi Materials Silicon Corporation, Tokyo (JP)

( * ) Notice: Subject to any disclaimer, the term of this patent is extended or adjusted under 35 U.S.C. 154(b) by 13 days.

(21) Appl. No.: 09/667,885

(22) Filed: Sep. 22, 2000

(51) Int. Cl.$^7$ ............................................. C30B 33/02
(52) U.S. Cl. ........................ 117/3; 117/11; 117/13; 438/795; 432/1
(58) Field of Search ..................... 117/3, 11, 13; 438/795; 432/1

(56) References Cited

U.S. PATENT DOCUMENTS

| | | | | |
|---|---|---|---|---|
| 5,674,756 A | * | 10/1997 | Satoh et al. | 438/471 |
| 5,788,763 A | * | 8/1998 | Hayashi et al. | 117/2 |
| 5,919,302 A | * | 7/1999 | Falster et al. | 117/15 |
| 5,954,873 A | * | 9/1999 | Hourai et al. | 117/13 |
| 5,968,264 A | * | 10/1999 | Iida et al. | 117/217 |
| 6,139,625 A | * | 10/2000 | Tamatsuka et al. | 117/19 |
| 6,413,310 B1 | * | 7/2002 | Tamatsuka et al. | 117/3 |
| 6,428,619 B1 | * | 8/2002 | Koya et al. | 117/84 |

FOREIGN PATENT DOCUMENTS

EP  889510 A1 * 1/1999 ........... B05C/13/00

* cited by examiner

Primary Examiner—Benjamin L. Utech
Assistant Examiner—Matthew Song
(74) Attorney, Agent, or Firm—Reed Smith LLP

(57) ABSTRACT

An ingot is manufactured by pulling it up such that V/Ga and V/Gb become 0.23 to 0.50 mm$^2$/minute ° C., respectively, where V (mm/minute) is a pulling-up speed, and Ga (° C./mm) is and axial temperature gradient at the center of the ingot and Gb (° C./mm) is an axial temperature gradient at the edge of the ingot at temperatures in a range of 1,300° C. to a melting pointy of silicon. A wafer obtained by slicing the ingot is heat treated in a reductive atmosphere at temperature in a renge of 1,050° C. to 1,220° C. for 30 to 150 minutes. A silicon wafer free of OSF's, free of COP's, and substantially free of contamination such as Fe and of occurence of slip, is obtained.

1 Claim, 15 Drawing Sheets

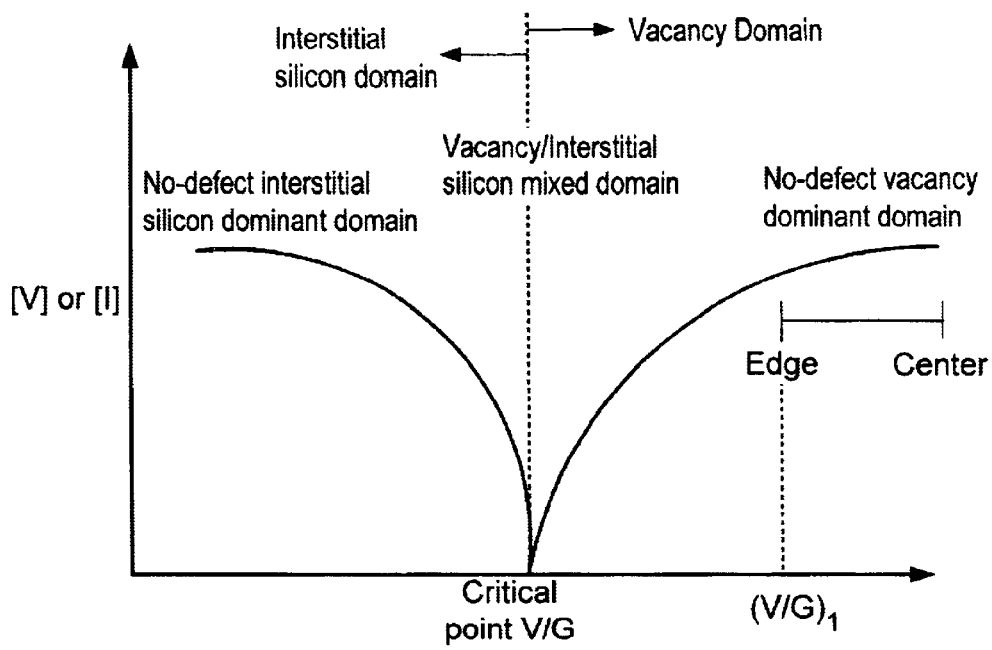
F I G. 1
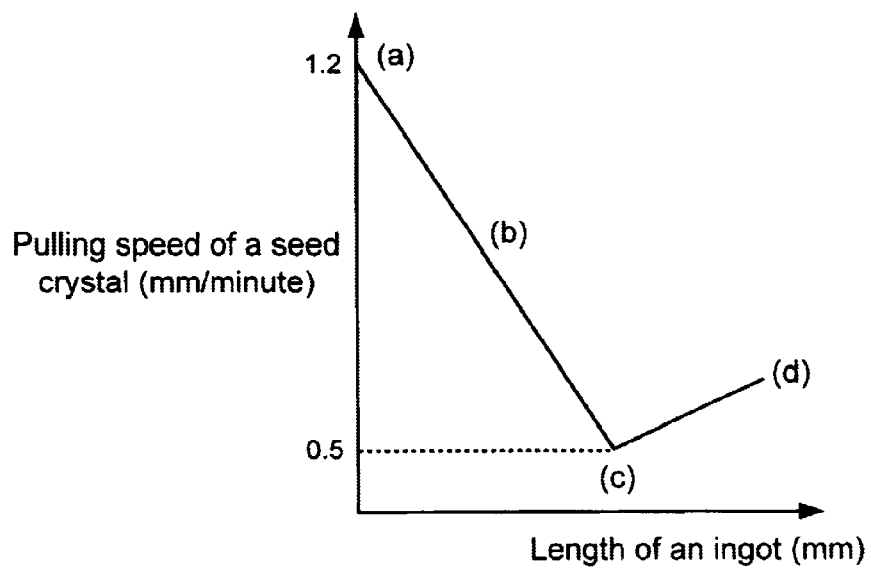
F I G. 2

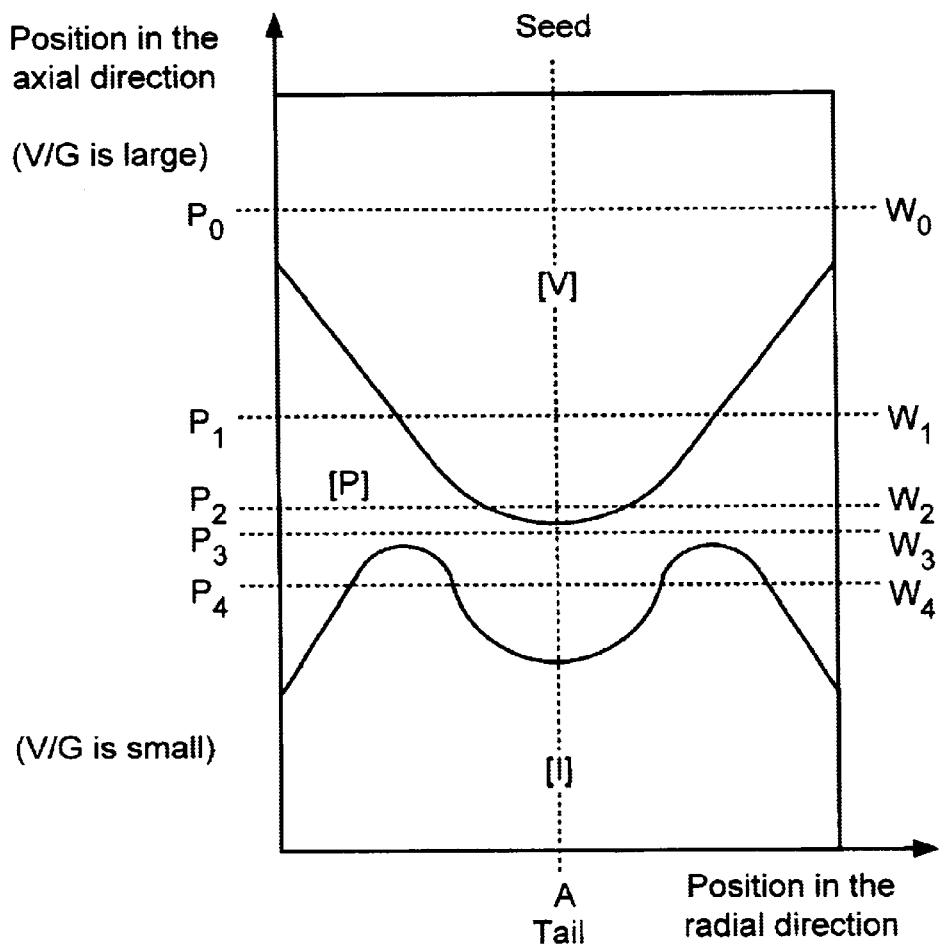
F I G. 3

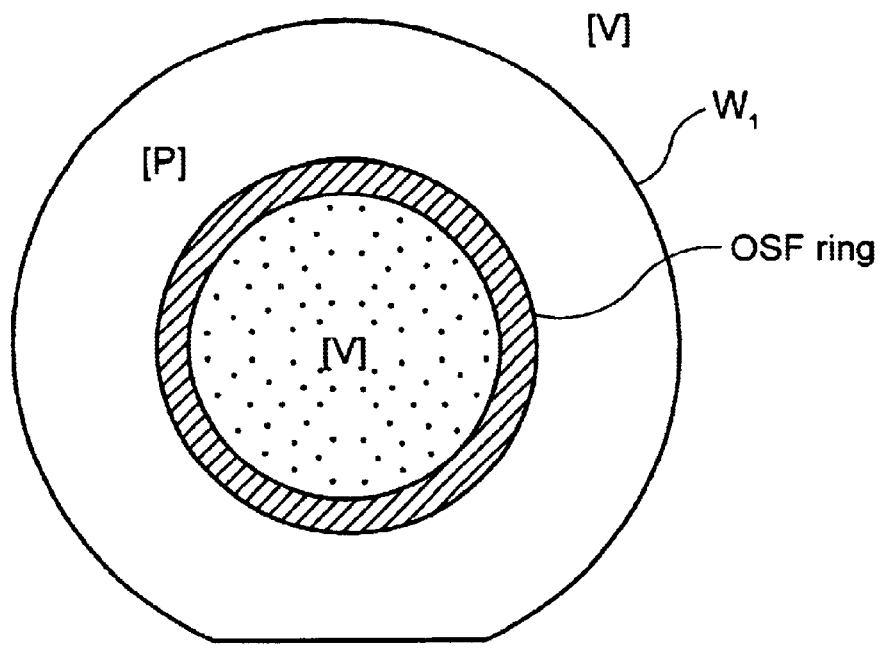
F I G. 4
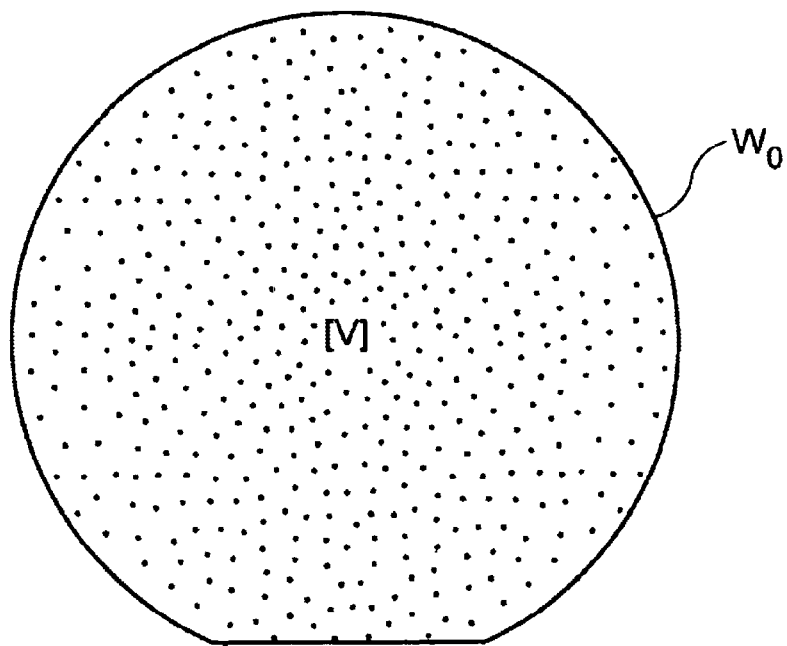
F I G. 5

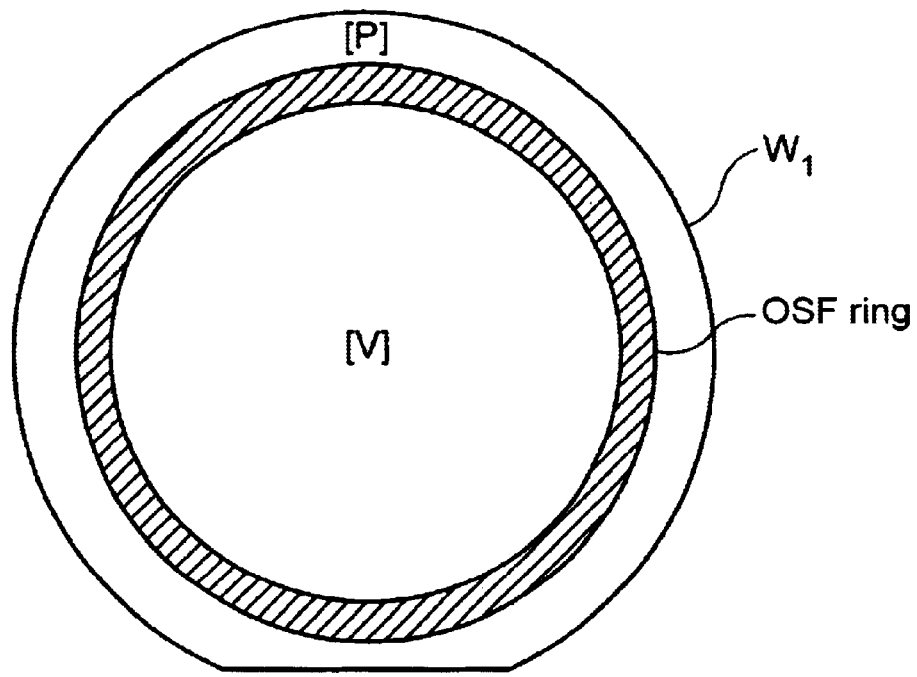
F I G. 11
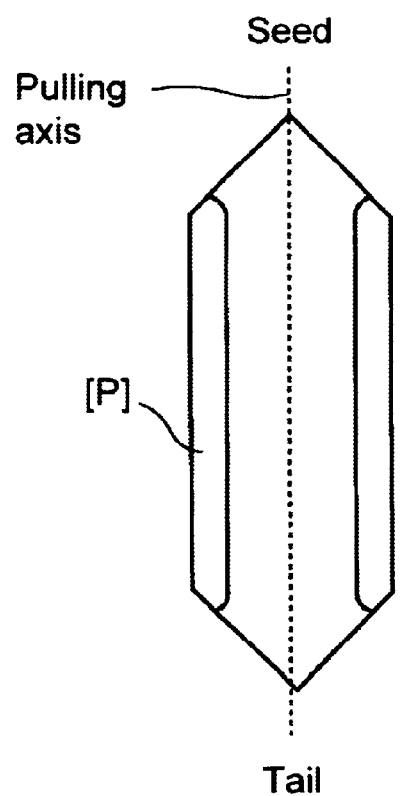
F I G. 12

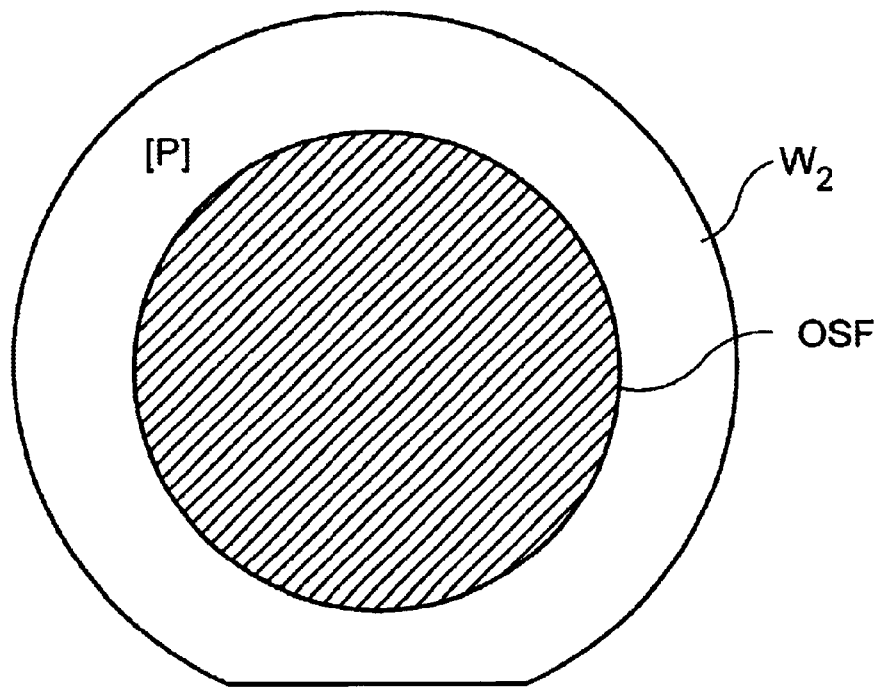
F I G. 13
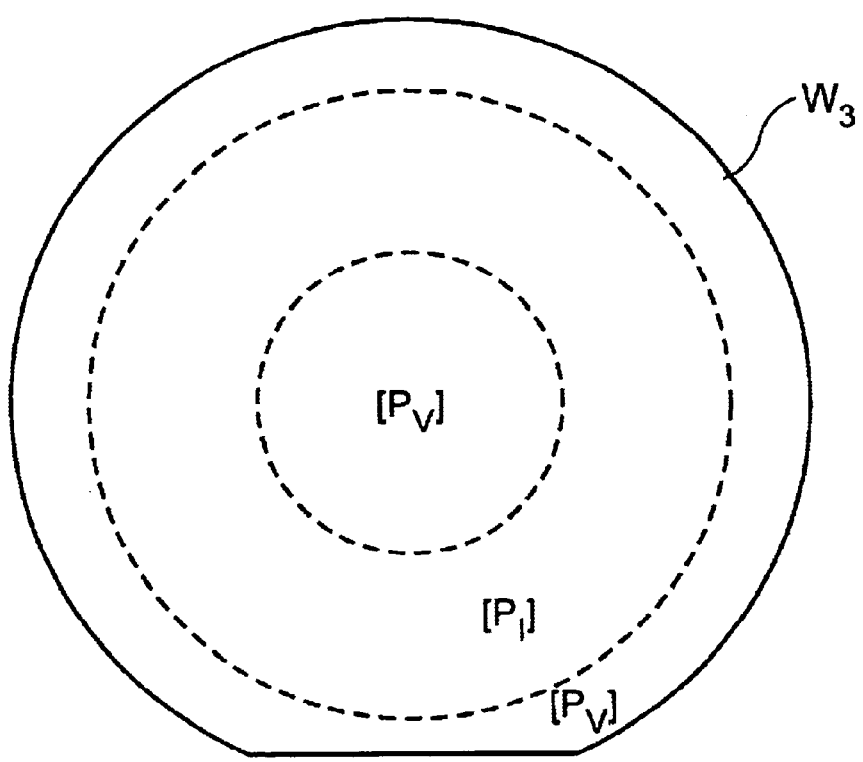
F I G. 14

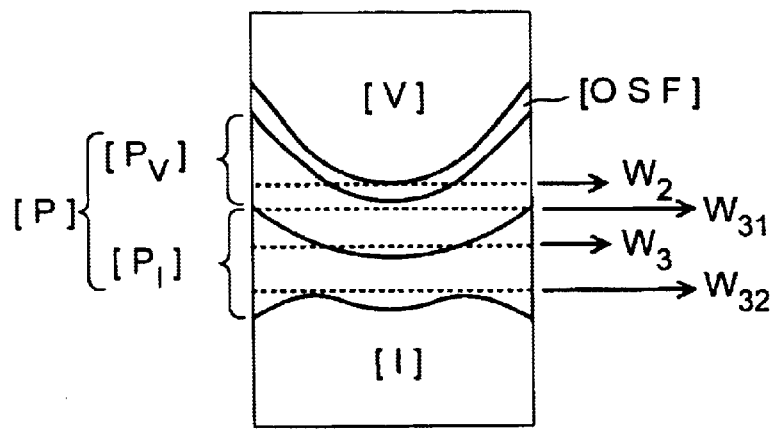
F I G. 16
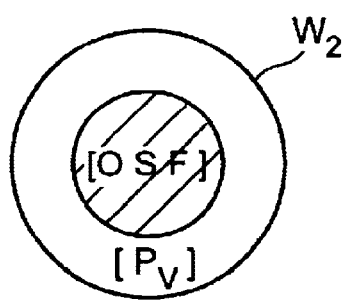
F I G. 17A
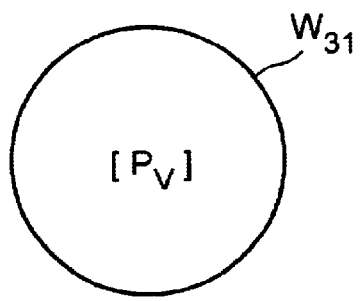
F I G. 17B
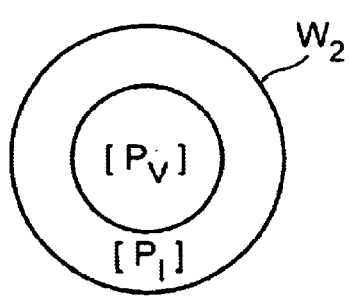
F I G. 17C
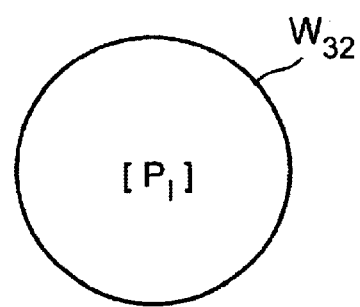
F I G. 17D

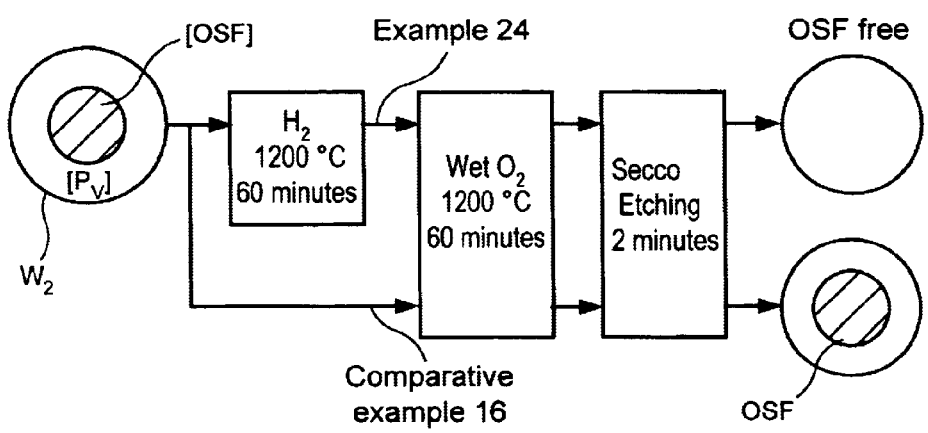
F I G. 22
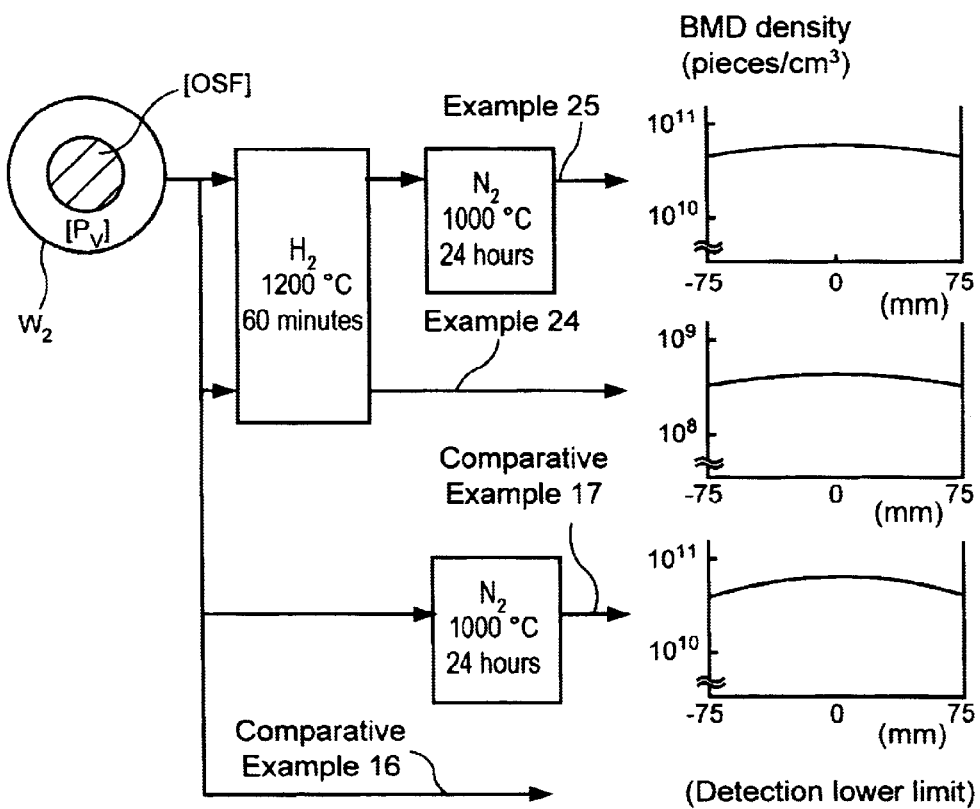
F I G. 23

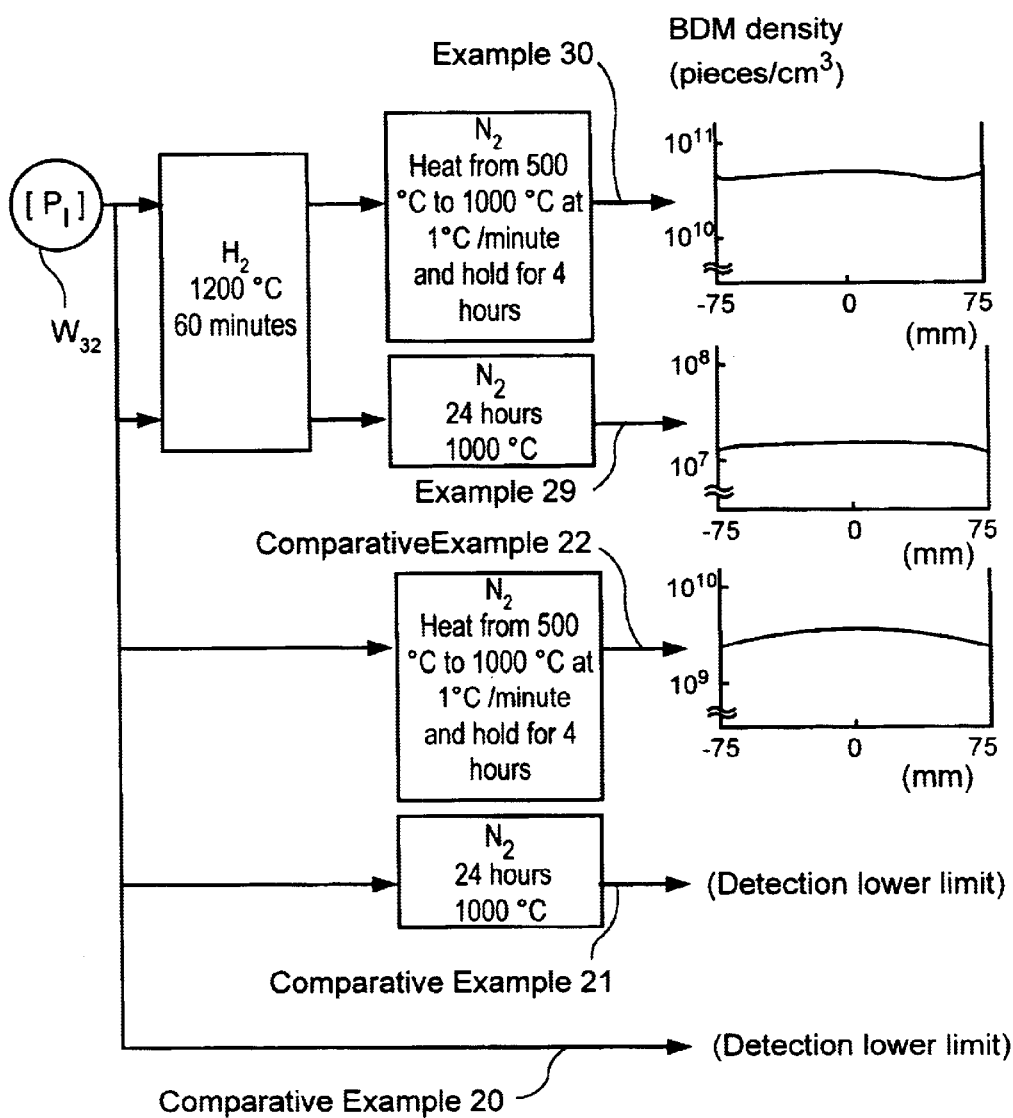
F I G. 25

SILICON WAFER, AND MANUFACTURING METHOD AND HEAT TREATMENT METHOD OF THE SAME

BACKGROUND OF THE INVENTION

1. Field of the Invention

The present invention relates to a semiconductor integrated circuit oriented silicon wafer sliced out of a silicon ingot manufactured by a Czochralski method (hereinafter called "CZ method"), and to a manufacturing method of the silicon wafer. The present invention further relates to a method for heat treating such a semiconductor integrated circuit oriented silicon wafer, so as to render such a silicon wafer to exhibit an intrinsic gettering effect (hereinafter called "IG effect").

2. Description of the Related Art

Recently, causes of deterioration of yields in processes for manufacturing semiconductor integrated circuits include existence of: micro defects of oxygen precipitations which lead to nuclei of oxidation induced stacking faults (hereinafter called "OSF's"); crystal originated particles (hereinafter called "COP's"); and an interstitial-type large dislocation (hereinafter called "L/D"). Micro defects as nuclei of OSF's are introduced into a silicon ingot during crystal growth, and actualize such as in an oxidation process on manufacturing semiconductor devices, leading to malfunctions such as increase of leakage current of fabricated devices. Meantime, cleaning mirror-polished silicon wafers by a mixed solution of ammonia and hydrogen peroxide leads to formation of pits on the wafer surface, and such pits are detected as particles similarly to real or intrinsic particles. Such pits are called COP's, to distinguish them from real particles. COP's which are pits on a wafer surface cause deterioration of electric characteristics such as a time dependent dielectric breakdown (TDDB) characteristic and a time zero dielectric breakdown (TZDB) characteristic. Further, existence of COP's in a wafer surface causes physical steps during a wiring process of devices, and these steps cause wire breakage to thereby reduce the yield of products. On the other hand, an L/D is called a dislocation cluster, or a dislocation pit since a pit is formed when a silicon wafer having this defect is immersed in a selective etching solution containing hydrofluoric acid as a main ingredient. Such an L/D also causes deterioration of electric characteristics such as a leak characteristic and an isolation characteristic.

From the above, it is required to reduce OSF's, COP's and L/D's from a silicon wafer to be used for manufacturing a semiconductor integrated circuit.

As a method for reducing such OSF's and COP's, there has been conventionally disclosed one for heat treating a silicon wafer in an atmosphere of 100% hydrogen or in an atmosphere of mixed hydrogen and argon at temperatures in a range of 1,200° C. to a melting point of silicon, making use of an apparatus capable of rapidly heating and rapidly cooling the silicon wafer (Japanese Patent Application Laid-Open No. HEI-10-326790). By this method, the number of COP's of 0.12 $\mu$m or greater per 8-inch diameter wafer can be reduced to 50 or less, to thereby improve the yield having been deteriorated due to the time zero dielectric breakdown characteristic.

In the conventional method, however, there is used a silicon wafer in which the number of COP's of 0.12 $\mu$m or greater on the whole surface of an 8-inch diameter wafer is 300 or more before heat treatment, problematically resulting in that it will be extremely difficult to reduce the number of COP's down to substantially zero over the whole surface of the wafer and that the wafer is susceptible to contamination such as Fe due to the high-temperature heat treatment exceeding 1,250° C. in a reductive atmosphere. Further, the heat treatment at temperatures higher than 1,150° C. by the apparatus capable of rapidly heating and rapidly cooling tends to problematically cause slip which is a kind of crystal defect. In addition, rapid heating leads to suppression of oxygen precipitation nuclei to be introduced upon pulling up, resulting in that precipitation of such nuclei in a device process becomes insufficient and no gettering effects can be expected, so that the removing ability of the wafer for removing contaminous impurities due to metal contamination is defectively lowered.

Meanwhile, there has been conventionally disclosed a defect-free silicon wafer free of OSF's, COP's and L/D's, in Japanese Patent Application Laid-Open No. HEI-11-1393. This defect-free silicon wafer is one sliced out from a single silicon crystal ingot comprising a perfect domain [P] supposed to be free of agglomerates of vacancy point defects and free of agglomerates of interstitial silicon point defects within the ingot. The perfect domain [P] exists between an interstitial silicon point defect dominant domain [I] and a vacancy point defect dominant domain [V] within the single silicon crystal ingot. The silicon wafer comprising the perfect domain [P] is formed by determining a value of V/G (mm$^2$/minute ° C.) such that OSF's generated in a ring shape during a thermal oxidization treatment disappears at the center of the wafer, in which V (mm/minute) is a pulling-up speed of the ingot, and G (° C./minute) is a vertical temperature gradient of the ingot near the interface between a silicon melt and the ingot.

The silicon wafer sliced out from an ingot comprising the perfect domain [P] is free of OSF's, COP's and L/D's. However, oxygen precipitation is not necessarily caused within the wafer by the heat treatment in a device manufacturing process, leading to a possibility of an insufficient IG effect. Some semiconductor device manufacturers may demand silicon wafers which are free of OSF's, COP's and L/D's but have abilities for gettering metal contamination caused in the device process. Metal contamination of wafers having insufficient IG abilities in the device process leads to junction leakage, and to occurrence of malfunctions of devices due to a trap level of metal impurities.

Further, there has been proposed a heat treatment method for exhibiting an IG effect (Japanese Patent Application Laid-Open No. HEI-8-45945), comprising the steps of: holding a silicon wafer just ground and polished after sliced out from a single silicon crystal ingot at 500 to 800° C. for 0.5 to 20 hours, to thereby introduce oxygen precipitation nuclei into the wafer; rapidly heating the silicon wafer including the oxygen precipitation nuclei from a room temperature to temperatures of 800–1,000° C. and holding the wafer for 0.5 to 20 minutes; leaving the silicon wafer rapidly heated and held for 0.5 to 20 minutes, down to a room temperature; and heating the thus cooled silicon wafer from temperatures of 500 to 700° C. up to temperatures of 800 to 1,100° C. at a rate of 2 to 10° C./minute, and holding the silicon wafer at this temperature for 2 to 48 hours.

In this treating method, at the surface as well as the interior of the wafer rapidly heated under the aforementioned temperature condition, the concentration of interstitial silicon atoms temporarily becomes lower than a thermal equilibrium concentration, leading to a depleted condition of interstitial silicon atoms to thereby provide an environment where oxygen precipitation nuclei tend to stably grow. Simultaneously, generation of interstitial silicon atoms are caused at the wafer surface so as to fill the depleted interstitial silicon atoms into a stable condition, so that the generated interstitial silicon atoms start to diffuse into the interior of the wafer. The area near the wafer surface which has been in the depleted condition of interstitial silicon atoms immediately falls into a saturated condition so that oxygen precipitation nuclei start to disappear. However, it will take some period of time for interstitial silicon atoms grown in the wafer surface to diffuse into the wafer interior. Thus, the deeper the distance from the wafer surface into the wafer interior, the longer the period of time over which an environment for easy growth of oxygen precipitation nuclei is maintained. Therefore, the closer to the wafer surface, the lower the density of oxygen precipitation nuclei. Further, the longer the heat treatment time (0.5 to 20 minutes), the greater the thickness of a denuded zone (hereinafter called "DZ") in which oxygen precipitation nuclei, i.e., defects are not formed. Moreover, the higher the temperature in the range of 800 to 1,000° C., the larger the diffusion coefficient of interstitial silicon atoms, so that the thickness of the DZ becomes large in a short time.

Rapidly heating, leaving at a room temperature and then heating again the wafer up to temperatures of 800 to 1,100° C. results in that those oxygen precipitation nuclei within the wafer, which have survived with the rapid heating, grow into oxygen precipitations and become stable IG sources.

However, the aforementioned heat treatment method requires, as a pre-treatment for generating IG sources, introducing oxygen precipitation nuclei into a silicon wafer just ground and polished by holding the wafer at 500 to 800° C. for 0.5 to 20 hours, and heat treating after rapid heating so as to render oxygen precipitation nuclei within the wafer to grow into oxygen precipitations. This causes a problem of unnecessarily many times of heat treatment in the state of wafer.

Further, the V/G value for forming a silicon wafer comprising the perfect domain [P] is proportional to a pulling-up speed V of an ingot when the temperature gradient G is constant, thereby requiring that the ingot is pulled up at a relatively slow speed controlled within a narrow range. However, it is not necessarily easy to technically satisfy such a requirement, and the productivity of ingot is never high.

To solve this problem, there has been proposed a method for pulling up a single crystal of silicon at an $N_2(V)$ domain repleted with oxygen precipitations (corresponding to the $[P_V]$ domain of the present invention) outside an OSF ring or at $N_1(V)$ domain and $N_2(V)$ domain inside and outside the OSF ring inclusive of the OSF ring, in a defect distribution diagram having an ordinate representing a V/G value and an abscissa representing a distance D from the center of crystal to the edge of crystal (Japanese Patent Application Laid-Open No. HEI-11-157996). According to this method under a readily controllable manufacturing condition, there can be manufactured a silicon wafer, which is free of the domain [I] and domain [V], is at an extremely low defect density over the entire crystal, and is capable of exhibiting an IG effect by oxygen precipitations, while maintaining a higher productivity.

However, in the manufacturing method of a single crystal of silicon described in the Japanese Patent Application Laid-Open No. HEI-11-157996, in order to prevent OSF nuclei from growing upon an thermal oxidization treatment of OSF's in a silicon wafer condition, there is imposed restriction to use a silicon wafer having an oxygen concentration within the grown crystal restricted to less than 24 ppma (ASTM '79 value) [corresponding to approximately $1.2 \times 10^{18}$ atoms/cm$^3$ (old ASTM)] or restricted to control the heat history such that the period of time for passing through the temperature range from 1,050° C. to 850° C. becomes 140 minutes or less.

SUMMARY OF THE INVENTION

It is therefore a first object of the present invention to provide a silicon wafer, which is free of OSF's, is capable of reducing the number of COP's greater than 0.12 μm down to substantially zero, and is substantially free of contamination such as Fe and of occurrence of slip, and to provide a method for manufacturing such a silicon wafer.

It is a second object of the present invention to provide a silicon wafer free of OSF's and COP's and substantially free of contamination such as Fe and of occurrence of slip, and to provide a method for manufacturing such a silicon wafer.

It is a third object of the present invention to provide a silicon wafer in which oxygen precipitations uniformly appear from the center toward the edge of the wafer to thereby exhibit an IG effect, upon heat treating the wafer in a semiconductor device manufacturing process.

It is a fourth object of the present invention to provide a heat treatment method for obtaining a silicon wafer which is free of OSF's and COP's and substantially free of contamination such as Fe and of occurrence of slip, even after the conventional OSF actualization heat treatment.

It is a fifth object of the present invention to provide a heat treatment method of a silicon wafer which is free of existence of agglomerates of point defects and is capable of exhibiting a desired IG effect with a reduced number of heat treatments in a silicon wafer condition.

It is a sixth object of the present invention to provide a manufacturing method of a silicon wafer which is free of existence of agglomerates of point defects and by which an IG effect is exhibited, even when the silicon wafer has been sliced out from an ingot comprising a mixed domain of a domain $[P_V]$ and a domain $[P_I]$ and has an oxygen concentration of $0.8 \times 10^{18}$ to $1.4 \times 10^{18}$ atoms/cm$^3$ (old ASTM).

It is a seventh object of the present invention to provide a silicon wafer which is manufactured by this method and has a higher IG ability.

It is an eighth object of the present invention to provide a heat treatment method of a silicon wafer which is free of existence of agglomerates of point defects and by which an IG effect is exhibited, even when the silicon wafer has been sliced out from an ingot comprising one or both of a domain $[P_V]$ and a domain $[P_I]$ and has an oxygen concentration of $1.2 \times 10^{18}$ atoms/cm$^3$ (old ASTM) or more.

It is a ninth object of the present invention to provide a heat treatment method of a silicon wafer which is free of existence of agglomerates of point defects and by which a uniform IG effect is exhibited within the wafer surface, even when the silicon wafer has been sliced out from an ingot comprising a mixed domain of a domain [OSF] and a domain $[P_V]$ and has an oxygen concentration of $1.2 \times 10^{18}$ atoms/cm$^3$ (old ASTM) or more.

It is a tenth object of the present invention to provide a heat treatment method of a silicon wafer free of existence of agglomerates of point defects, without requiring any oxygen doner killing treatments.

The first aspect of the present invention resides in a silicon wafer, wherein no oxidation induced stacking faults (OSF's) are generated in the silicon wafer when the silicon wafer is heat treated in an oxygen atmosphere at temperatures in a range of 1,000° C.±30° C. for 2 to 5 hours, and subsequently heat treated at temperatures in a range of 1,130° C.±30° C. for 1 to 16 hours; wherein the number of crystal originated particles (COP's) smaller than 0.12 μm in the wafer surface is within a range of 3 to 10 pieces/cm$^2$; and wherein the number of crystal originated particles (COP's) of 0.12 μm or greater in the wafer surface is 0.5 pieces/cm$^2$ or less.

The second aspect of the present invention resides in a method of manufacturing a silicon wafer, comprising the steps of: pulling up a single silicon crystal ingot from a silicon melt; and slicing the ingot into a silicon wafer; wherein the ingot is pulled up such that V/Ga and V/Gb become 0.23 to 0.50 mm$^2$/minute ° C., respectively, where V (mm/minute) is a pulling-up speed, and Ga (° C./mm) is an axial temperature gradient at the center of the ingot and Gb (° C./mm) is an axial temperature gradient at the edge of the ingot at temperatures in a range of 1,300° C. to a melting point of silicon.

The third aspect of the present invention resides in a method for heat treating a silicon wafer including no crystal originated particles nor dislocation pits in the surface of the silicon wafer, in which OSF's should actualize at the center of the silicon wafer if the silicon wafer was heat treated in a oxygen atmosphere at temperatures of 1,000° C.±30° C. for 2 to 5 hours and subsequently heat treated at temperatures of 1,130° C.±30° C. for 1 to 16 hours, the method comprising the step of: heat treating the silicon wafer in an atmosphere of 100% oxygen or in a mixed atmosphere of oxygen and nitrogen at temperatures of 1,130° C. to 1,200° C. for 1 minute to 6 hours.

The fourth aspect of the present invention resides in a method for heat treating a silicon wafer including no crystal originated particles nor dislocation pits in the surface of the silicon wafer, in which OSF's should actualize at the center of the silicon wafer if the silicon wafer was heat treated in a oxygen atmosphere at temperatures of 1,000° C.±30° C. for 2 to 5 hours and subsequently heat treated at temperatures of 1,130° C.±30° C. for 1 to 16 hours, the method comprising the step of: heat treating the silicon wafer in an atmosphere of 100% argon at temperatures of 1,130° C. to 1,200° C. for 1 minute to 6 hours.

The fifth aspect of the present invention resides in a method for heat treating a silicon wafer including no crystal originated particles nor dislocation pits in the surface of the silicon wafer, in which OSF's should actualize at the center of the silicon wafer if the silicon wafer was heat treated in a oxygen atmosphere at temperatures of 1,000° C.±30° C. for 2 to 5 hours and subsequently heat treated at temperatures of 1,130° C.±30° C. for 1 to 16 hours, the method comprising the step of: heat treating the silicon wafer in an atmosphere of 100% hydrogen or in a mixed atmosphere of hydrogen and argon at temperatures of 1,150° C. to 1,250° C. for 1 minute to 4 hours.

The sixth aspect of the present invention resides in a heat treatment method of a silicon wafer for rendering the silicon wafer to exhibit an IG effect, in which when the silicon wafer was heat treated by an OSF-actualizing heat treatment, OSF's should be generated in 25% or more of the entire area of the silicon wafer and oxygen precipitations accompanied with no dislocation generation should be generated at a density of 1×10$^5$ to 3×10$^7$ pieces/cm$^2$, the method comprising the step of: rapidly heating the silicon wafer in a hydrogen gas atmosphere or in an atmosphere including hydrogen gas from a room temperature up to 1,100° C. to 1,250° C. at a temperature elevating speed of 3° C./minute to 150° C./second, and then holding the silicon wafer for 1 minute to 2 hours.

According to the heat treatment method of the sixth aspect, adoption of the wafer including oxygen precipitations at a predetermined density in the OSF domain existing at the above ratios eliminates a conventional preheating process for introducing oxygen precipitation nuclei into the wafer and a conventional growing process of oxygen precipitation nuclei, and rapidly heating the polished wafer under the above condition leads to a higher IG effect.

The seventh aspect of the present invention resides in a heat treatment method of a silicon wafer for rendering the silicon wafer to exhibit an IG effect, in which the silicon wafer comprises a mixed domain of [P$_V$] and [P$_I$] and has an oxygen concentration of 0.8×10$^{18}$ to 1.4×10$^{18}$ atoms/cm$^3$ (old ASTM), where [P$_I$] is a domain neighboring with a domain [I] dominated by interstitial silicon point defects, is classified into a perfect domain [P] including no agglomerates of point defects, and has a concentration of interstitial silicons lower than the lowest concentration of interstitial silicons capable of forming interstitial dislocations, and where [P$_V$] is a domain neighboring with a domain [V] dominated by vacancy point defects, is classified into the perfect domain [P], and has a concentration of vacancies equal to or lower than a concentration of vacancies capable of forming COP's or FPD's, the method comprising the steps of: conducting a first step heat treatment for holding the silicon wafer in an atmosphere of nitrogen, argon, hydrogen or oxygen or mixture thereof at temperatures of 600° C. to 850° C. for 120 to 250 minutes; and subsequently conducting a second step heat treatment for rapidly heating the silicon wafer in a hydrogen gas or in an atmosphere including a hydrogen gas from a room temperature up to temperatures of 1,100° C. to 1,250° C. at a temperature elevating speed of 3° C./minute to 150° C./second, and for holding the silicon wafer for 1 minute to 2 hours.

The eighth aspect of the present invention resides in a heat treatment method of a silicon wafer for rendering the silicon wafer to exhibit an IG effect, in which the silicon wafer comprises a mixed domain of [P$_V$] and [P$_I$] and has an oxygen concentration of 0.8×10$^{18}$ to 1.4×10$^{18}$ atoms/cm$^3$ (old ASTM), where [P$_I$] is a domain neighboring with a domain [I] dominated by interstitial silicon point defects, is classified into a perfect domain [P] including no agglomerates of point defects, and has a concentration of interstitial silicons lower than the lowest concentration of interstitial silicons capable of forming interstitial dislocations, and where [P$_V$] is a domain neighboring with a domain [V] dominated by vacancy point defects, is classified into the perfect domain [P], and has a concentration of vacancies equal to or lower than a concentration of vacancies capable of forming COP's or FPD's, the method comprising the steps of: conducting a first step heat treatment for heating the silicon wafer in an atmosphere of nitrogen, argon, hydrogen or oxygen or mixture thereof from a room temperature up to 1,150° C. to 1,200° C. at a temperature elevating speed of 10° C./second to 150° C./second, and for holding the silicon wafer at temperatures of 1,150° C. to 1,200° C. for 0 to 30 seconds; and subsequently conducting a second step heat treatment for rapidly heating the silicon wafer in a hydrogen gas or in an atmosphere including a hydrogen gas from a room temperature up to temperatures of 1,100° C. to 1,250° C. at a temperature elevating speed of 3° C./minute to 10° C./second, and for holding the silicon wafer for 1 minute to 2 hours.

According to the heat treatment method of the seventh or eighth aspect, when the silicon wafer comprises a mixed domain of [$P_V$] and [$P_I$] and has an oxygen concentration of $0.8 \times 10^{18}$ to $1.4 \times 10^{18}$ atoms/cm$^3$ (old ASTM), conducting the first step heat treatment for the silicon wafer results in that oxygen precipitation nuclei appear also in the domain [$P_I$] into which no oxygen precipitation nuclei have been introduced upon crystal growth, and simultaneously therewith, the density of oxygen precipitation nuclei is increased in the domain [$P_V$] into which oxygen precipitation nuclei have been introduced upon crystal growth. Thus, when the silicon wafer treated by the first step heat treatment is rapidly heated in a hydrogen gas or in an atmosphere including a hydrogen gas to thereby conduct the second step heat treatment, the oxygen precipitation nuclei grow into oxygen precipitations, so that the silicon wafer comprising even the domain [$P_V$] and domain [$P_I$] is brought to have an IG effect over the entire wafer surface. Hereinafter, "oxygen precipitations" may be called "BMD (Bulk Micro Defect)".

The ninth aspect of the present invention resides in a method for heat treating a silicon wafer sliced out from a single silicon crystal ingot comprising a perfect domain [P], where, in the single silicon crystal ingot, [I] is a domain dominated by interstitial silicon point defects, [V] is a domain dominated by vacancy point defects, the perfect domain [P] includes no agglomerates of interstitial silicon point defects and no agglomerates of vacancy point defects, [$P_I$] is a domain neighboring with the domain [I], is classified into the perfect domain [P], and has a concentration of interstitial silicons lower than the lowest concentration of interstitial silicons capable of forming interstitial dislocations, and [$P_V$] is a domain neighboring with the domain [V], is classified into the perfect domain [P], and has a concentration of vacancies equal to or lower than a concentration of vacancies capable of forming COP's or FPD's; the method comprising the steps of: slicing out the silicon wafer from the single silicon crystal ingot, the single silicon crystal ingot comprising one or both of the domain [$P_V$] and the domain [$P_I$] and having an oxygen concentration of $1.2 \times 10^{18}$ atoms/cm$^3$ or more (old ASTM), and heating the silicon wafer in an atmosphere of a hydrogen gas or an argon gas from a room temperature up to temperatures of 900° C. to 1,200° C. at a temperature elevating speed of 5 to 50° C./minute, and then holding the silicon wafer for 5 to 120 minutes, to thereby conduct a first step heat treatment.

The tenth aspect of the present invention resides in a method for heat treating a silicon wafer sliced out from a single silicon crystal ingot comprising a perfect domain [P] including a domain [OSF], where, in the single silicon crystal ingot, [I] is a domain dominated by interstitial silicon point defects, [V] is a domain dominated by vacancy point defects, the perfect domain [P] includes no agglomerates of interstitial silicon point defects and no agglomerates of vacancy point defects, the domain [OSF] is classified into the domain [V], and OSF's are to generate in the domain [OSF] when the ingot in a silicon wafer state is subjected to a thermal oxidization treatment, [$P_I$] is a domain neighboring with the domain [I], is classified into the perfect domain [P], and has a concentration of interstitial silicons lower than the lowest concentration of interstitial silicons capable of forming interstitial dislocations, and [$P_V$] is a domain neighboring with the domain [V], is classified into the perfect domain [P], and has a concentration of vacancies equal to or lower than a concentration of vacancies capable of forming COP'S or FPD'S; the method comprising the steps of: slicing out the silicon wafer from the single silicon crystal ingot, the single silicon crystal ingot comprising a mixed domain of the domain [OSF] and the domain [$P_V$] and having an oxygen concentration of $1.2 \times 10^{18}$ atoms/cm$^3$ or more (old ASTM), and heating the silicon wafer in an atmosphere of a hydrogen gas or an argon gas from a room temperature up to temperatures of 900° C. to 1,200° C. at a temperature elevating speed of 5 to 50° C./minute, and then holding the silicon wafer for 5 to 120 minutes, to thereby conduct a first step heat treatment.

According to the heat treatment method of the ninth or tenth aspect, even if the ingot has an oxygen concentration of $1.2 \times 10^{18}$ or more (old ASTM), when the silicon wafer sliced out from the ingot is heat treated under the above condition and where the silicon wafer comprises one or both of the domain [$P_V$] and domain [$P_I$] or comprises the domain [OSF] and the domain [$P_V$], those oxygen precipitation nuclei and OSF nuclei introduced into the wafer upon crystal growth shrink or disappear near the wafer surface by the out diffusion effect of oxygens within the wafer, to thereby form a DZ in the wafer surface. Further, since the oxygen concentration is $1.2 \times 10^{18}$ atoms/cm$^3$ (old ASTM) at the portion deeper than near the wafer surface, BMD's more than a predetermined density are generated to thereby exhibit an IG effect.

BRIEF DESCRIPTION OF THE DRAWINGS

FIG. 1 is a view showing a relationship between a V/G ratio and a vacancy point defect density or an interstitial silicon point defect density in a first embodiment of the present invention, based on a Voronkov theory;

FIG. 2 is a characteristic diagram showing a transition of a pulling-up speed for determining a desired pulling-up speed profile;

FIG. 3 is a schematic view of an X-ray tomographic image showing a vacancy point defect dominant domain, an interstitial silicon point defect dominant domain, and a perfect domain of a reference ingot according to the first embodiment of the present invention;

FIG. 4 is a view showing a situation where OSF's appear in a silicon wafer $W_1$ corresponding to a position $P_1$ in FIG. 3;

FIG. 5 is a view showing a situation where no OSF's appear in a silicon wafer $W_0$ of the first embodiment of the present invention, correspondingly to a position $P_0$ in FIG. 3;

FIG. 11 is a plan view showing a situation where OSF's appear in a silicon wafer $W_1$ corresponding to a position $P_1$ in FIG. 10;

FIG. 12 is a cross-sectional view of an ingot sliced along an axial direction including the ingot axis according to the third embodiment, corresponding to a position $P_2$ in FIG. 10;

FIG. 13 is a plan view showing a situation where OSF's appear at the center of a silicon wafer $W_2$ according to the third embodiment of the present invention, corresponding to the position $P_2$ in FIG. 10;

FIG. 14 is a plan view showing a situation where a domain $[P_V]$ has appeared in the center and the edge and a domain $[P_I]$ has appeared between them, in a silicon wafer $W_3$ of fourth and fifth embodiments of the present invention corresponding to a position $P_3$ in FIG. 10;

FIG. 16 is a view corresponding to FIG. 15B;

FIG. 17A is a plan view of a wafer corresponding to $W_1$ in FIG. 16;

FIG. 17B is a plan view of a wafer corresponding to $W_2$ in FIG. 16;

FIG. 17C is a plan view of a wafer corresponding to $W_3$ in FIG. 16;

FIG. 17D is a plan view of a wafer corresponding to $W_4$ in FIG. 16;

FIG. 22 is a view showing heat treatment methods and OSF actualization treatment results of silicon wafers $W_1$ of an example 24 and a comparative example 16;

FIG. 23 is a view showing heat treatment methods of silicon wafers $W_1$ of examples 24, 25 and comparative examples 16, 17, and a generation status of BMD's in the silicon wafers $W_1$;

FIG. 25 is a view showing heat treatment methods of silicon wafers $W_4$ of examples 29, 30 and comparative examples 20, 21, 22 and a generation status of BMD's in the silicon wafers W4.

DETAILED DESCRIPTION OF THE EMBODIMENTS

Figure 6:
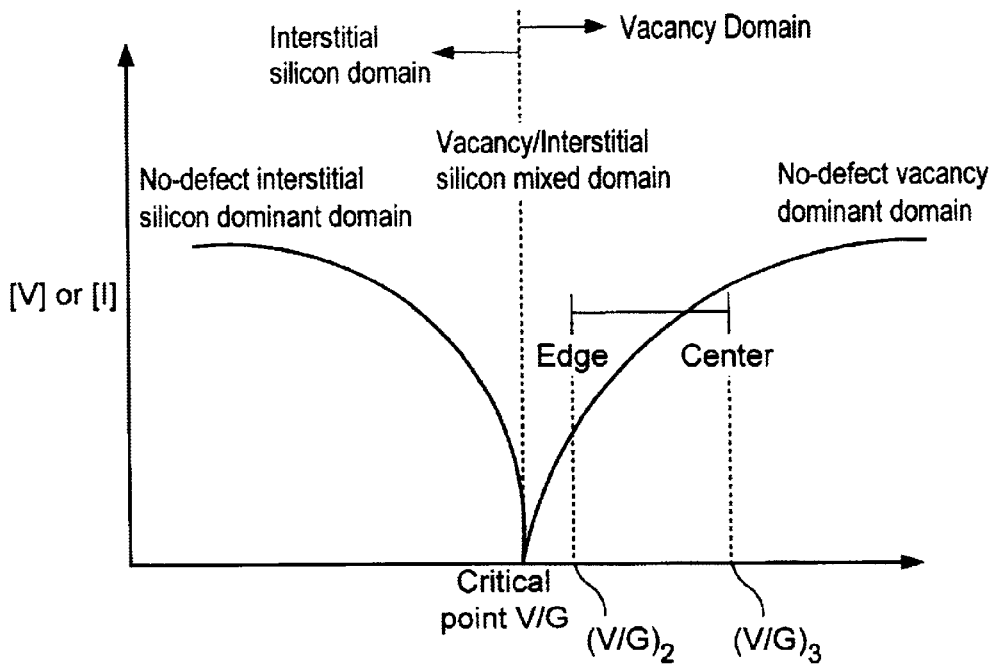
FIG. 6 is a view showing a relationship between a V/G ratio and a vacancy point defect density or an interstitial silicon point defect density in a second embodiment of the present invention, based on the Voronkov theory.
Figure 7:
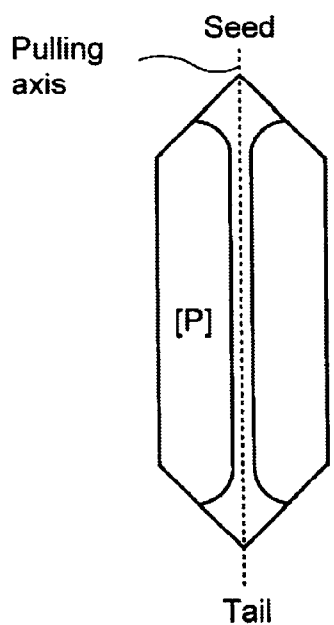
FIG. 7 is a cross-sectional view of an ingot sliced along an axial direction including the ingot axis according to the second embodiment, corresponding to a position $P_2$ in FIG. 3.

[A] First Embodiment of the Present Invention

Each of silicon wafers according to first through seventh embodiments of the present invention is fabricated by pulling up an ingot from a silicon melt within a hot zone furnace by a CZ method at a predetermined pulling-up speed profile based on a Voronkov theory, and by slicing the ingot.

Generally, when an ingot of single crystal of silicon is pulled up from a silicon melt within a hot zone furnace by a CZ method, there are caused point defects and agglomerates (three-dimensional defects) as defects in the single crystal of silicon. Point defects are classified into two general types, i.e., a vacancy point defect and an interstitial point defect. The vacancy point defect is a type where one silicon atom is omitted from a normal position within a silicon crystal lattice. Such a vacancy leads to a vacancy point defect. Meanwhile, the presence of a silicon atom at a non-lattice point (interstitial site) leads to an interstitial silicon point defect.

Further, point defects are generally formed at an interface between a silicon melt (melted silicon) and an ingot (solid silicon). However, as the ingot is pulled up, the portion having been the interface starts to be cooled. During the cooling, vacancy point defects or interstitial point defects diffuse to be mutually merged to thereby form vacancy agglomerates or interstitial agglomerates, respectively. In other words, agglomerates are threedimensional structures generated by mergence of point defects.

Agglomerates of vacancy point defects include defects called "LSTD (Laser Scattering Tomograph Defects)" or "FPD (Flow Pattern Defects)" in addition to the aforementioned COP, while agglomerates of interstitial silicon point defects include defects called "L/D" as noted above. Further, FPD's are sources of traces which exhibit a unique flow pattern which appears when a silicon wafer fabricated by slicing an ingot is Secco etched (i.e., etching by a mixed solution of $K_2Cr_2O_7$:50% HF:pure water=44 g:2,000 cc:1, 000 cc) for 30 minutes without agitation. LSTD are sources which have refractive indexes different from that of silicon and which generate scattered light upon radiation of infrared rays into a single crystal of silicon.

The aforementioned Voronkov theory is to control a V/G ratio ($mm^2$/minute ° C.) so as to grow a high purity ingot having fewer defects, where V (mm/minute) is a pulling-up speed of an ingot and G (° C./mm) is a temperature gradient at an interface between an ingot and silicon melt in a hot zone structure. According to this theory, the relationship between V/G and point defect density is diagramatically represented as shown in FIG. 1 in which the abscissa represents V/G and the ordinate represents a vacancy point defect density and an interstitial silicon point defect density, to thereby demonstrate that the boundary between a vacancy domain and an interstitial silicon domain is determined by the V/G ratio. More specifically, an ingot dominated by a vacancy point defect density is formed when the V/G ratio is greater than a critical point, while an ingot dominated by an interstitial silicon point defect density is formed when the V/G ratio is smaller than the critical point.

The predetermined pulling-up speed profile for the first embodiment of the present invention is determined such that the ratio (V/G) of a pulling-up speed to a temperature gradient largely exceeds a first critical ratio $((V/G)_1)$ for restricting vacancy agglomerates to a vacancy point defect dominant domain at the center of an ingot, when the ingot is pulled up from a silicon melt within a hot zone furnace. This pulling-up speed profile is determined by a simulation based on the Voronkov theory, such as by empirically slicing a reference ingot in an axial direction, by empirically slicing a reference ingot into wafers, or by combining these techniques. Namely, this determination is performed by confirming the axial slice of the ingot and sliced wafers after the simulation, and then repeating the simulation. There are determined a plurality of kinds of pulling-up speeds in a predetermined range, and a plurality of reference ingots are grown. As shown in FIG. 2, the pulling-up speed profile for the simulation is adjusted to (a) a higher pulling-up speed such as 1.2 mm/min, (c) a lower pulling-up speed such as 0.5 mm/min and again to (d) a high pulling-up speed of 0.5 mm/min. The aforementioned lower pulling-up speed may be 0.4 mm/min or less, and the pulling-up speeds (b) and (d) are preferably made to be linear.

Multiple reference ingots pulled up at different speeds are sliced in axial directions, respectively. There is determined an optimum V/G ratio based on a correlation between the axial slices, confirmation of wafers, and the result of the simulation, then an optimum pulling-up speed profile is determined, and ingots are manufactured based on such a profile. The actual pulling-up speed profile depends on various parameters such as a diameter of a desired ingot, a specific hot zone furnace to be used, and a quality of a silicon melt, without limited thereto.

FIG. 3 actually shows a cross-sectional view of an ingot obtained by gradually decreasing the pulling-up speed to thereby continuously lower the V/G ratio. In FIG. 3, the mark [V] represents a domain dominated by vacancy point defects and including agglomerates of vacancy point defects within an ingot, the mark [I] represents a domain dominated by interstitial silicon point defects and including agglomerates of interstitial silicon point defects, and the mark [P] represents a perfect domain including no agglomerates of vacancy point defects and no agglomerates of interstitial silicon point defects.

Note, agglomerates of COP's and L/D's may present different values of detection sensitivities and detection lower limits, depending on detection methods. As such, the phrase "agglomerates of point defects do not exist" herein means that the number of agglomerates of point defects is less than a detection lower limit $(1 \times 10^3$ pieces/cm$^3)$ which is determined where one piece of defect agglomerate of a flow pattern (vacancy defect) and dislocation cluster (interstitial silicon point defect) is detected for a testing volume of $1 \times 10^{-3}$ cm$^3$ upon observing, as the testing volume, a product of an observing area and an etching allowance by an optical microscope after Secco etching a mirror-machined single crystal of silicon without agitation.

As shown in FIG. 3, the axial position $P_0$ of the ingot is a domain entirely dominated by vacancy point defects. The position $P_1$ includes a center domain dominated by vacancy point defects. The position $P_4$ includes a ring dominated by interstitial silicon point defects, and a center perfect domain. The position $P_3$ is an entirely perfect domain.

As apparent from FIG. 3, the wafer $W_0$ corresponding to the position $P_0$ is a domain entirely dominated by vacancy point defects. The wafer $W_1$ corresponding to the position $P_1$ includes a center domain dominated by vacancy point defects. The wafer $W_4$ corresponding to the position $P_4$ includes a ring dominated by interstitial silicon point defects, and a center perfect domain. The wafer $W_3$ corresponding to the position $P_3$ is an entirely perfect domain.

In the wafer $W_1$, an OSF ring is generated near half the radius of the wafer $W_1$ as shown in FIG. 4, when the wafer $W_1$ is heat treated at temperatures in a range of 1,000° C.±30° C. for 2 to 5 hours and subsequently heat treated at temperatures in a range of 1,130° C.±30° C. for 1 to 16 hours. The diameter of the OSF ring is increased from the wafer $W_1$ corresponding to the position $P_1$ toward the wafer $W_0$ corresponding to the position $P_0$, so that no OSF rings are caused in the wafer $W_0$ corresponding to the position $P_0$ since the OSF ring exceeds the diameter of the ingot as shown in FIG. 5.

The wafer of the first embodiment is the wafer $W_0$ corresponding to the position $P_0$. Generally, larger COP's tend to appear from the edge toward the center of the wafer $W_0$ corresponding to the position $P_0$. The method of the first embodiment is to grow the domain corresponding to the position $P_0$, over the whole length of an ingot. Concretely, this method is to pull up an ingot such that V/Ga and V/Gb become 0.23 to 0.50 mm$^2$/minute ° C., respectively, where Ga is an axial temperature gradient at the center of the ingot and Gb is an axial temperature gradient at the edge of the ingot. This pulling up method corresponds to claim 6. Pulling up so results in that the number of COP's of 0.12 μm or greater becomes 0.5 pieces/cm$^2$ or less, and the number of COP's smaller than 0.12 μm is restricted to a range of 3 to 10 pieces/cm$^2$. V/Ga and V/Gb lower than 0.23 mm$^2$/minute ° C. leads to a problem of occurrence of OSF's, and V/Ga and V/Gb exceeding 0.50 mm$^2$/minute ° C. leads to instability of growth of a single silicon crystal ingot.

COP's of 0.12 μm or greater are to be measured by the predetermined particle counter as described above. COP's of 0.10 μm or greater are to be measured by the predetermined particle counter as described above. Alternatively, COP's smaller than 0.12 μm are to be measured by counting FPD's, or measured based on "Method for Detecting Micro Pits in a Silicon Wafer" of Japanese Patent No. 2,520,316. This detecting method is to: clean the wafer surface at plural times under a certain condition using an ammonia-based cleaning solution until the number of pits on the surface of the silicon wafer can be measured using a particle counter; measure the number of pits on the surface of the wafer after cleaning by means of the particle counter; clean again the wafer surface under the same condition; measure the number of pits on the surface of the wafer after cleaning again by means of the particle counter; and detect the size and number of micro pits on the surface of the wafer after being cleaned once on the basis of the differences between the measurements and the number of times of cleaning until measurement becomes possible.

Since sizes of COP's may indicate different values depending upon the manufacturer and model of a particle counter, "COP of 0.12 μm" herein refers to COP's indicating a value of 0.12 μm by a perpendicular-input type particle counter of SFS6200 Series by KLA-Tencor, Inc., CR80 Series by ADE, Inc., or LS6000 Series by Hitachi Electronics Engineering, Ltd. Further, the value measured by the particle counter is not an actually measured value by an atomic force microscope (AFM), but a polystyrene-latex particle converted value.

In the silicon wafer of the first embodiment, the oxygen concentration within the wafer is further controlled. In the CZ method, the oxygen concentration within a wafer can be controlled such as by changing a flow rate to be supplied into a hot zone furnace, a rotational speed of a quartz crucible for storing a silicon melt, and a pressure within the hot zone furnace.

When manufacturers of semiconductor devices demand silicon wafers exhibiting IG effects, the oxygen concentration within wafers are rendered to be $1.2 \times 10^{18}$ atoms/cm$^3$ to $1.6 \times 10^{18}$ atoms/cm$^3$ (old ASTM) to thereby distribute oxygen atoms over the entire wafer. Namely, when this silicon wafer is heat treated by the semiconductor device manufacturer in a semiconductor device manufacturing process, oxygen precipitations appear at areas from the center toward the edge of the wafer to thereby exhibit an IG effect. To achieve such an oxygen concentration, the flow rate of argon is controlled to be 60 to 110 liter/minute, the rotational speed of a quartz crucible for storing a silicon melt is controlled to be 4 to 12 rpm, and the pressure within a hot zone furnace is controlled to be 20 to 80 Torr, for example.

When silicon wafers exhibiting IG effects are not desired by semiconductor device manufacturers, the oxygen concentration within wafers are set at values lower than $1.2 \times 10^{18}$ atoms/cm$^3$ (old ASTM). To achieve such an oxygen concentration, the flow rate of argon is controlled to be 80 to 150 liter/minute, the rotational speed of a quartz crucible for storing a silicon melt is controlled to be 4 to 9 rpm, and the pressure within a hot zone furnace is controlled to be 15 to 60 Torr, for example.

When silicon wafers fabricated by slicing ingots pulled up under the aforementioned conditions are heat treated in a reductive atmosphere at temperatures in a range of 1,050° C. to 1,220° C. for 30 to 150 minutes, COP's smaller than 0.12 μm even in a range of 3 to 10 pieces/cm$^2$ disappear if the number of COP's of 0.12 μm or greater is 0.5 pieces/cm$^2$ or less, particularly 0 pieces/cm$^2$. The temperature elevating speed at this heat treatment is rendered to be 15° C./minute or less. COP's do not sufficiently disappear below the aforementioned lowermost limits of temperature and time, and wafers may be contaminated such as by Fe above the uppermost limits. As a result, there can be obtained a wafer, the number of COP's in the entire wafer surface of which is zero (COP free), and which is substantially free of contamination such as Fe and of occurrence of slip. The reductive atmosphere includes an atmosphere of 100% hydrogen, an atmosphere of mixed hydrogen and argon, and an atmosphere of mixed hydrogen and nitrogen.

Further, when the wafer fabricated by slicing the ingot pulled up under the above condition is heat treated in a reductive atmosphere, COP's disappear, and agglomerates of vacancy point defects disappear at the interior of the wafer, particularly over a region from the wafer surface into a depth of at least 0.2 μm.

[B] Second Embodiment of the PresentInvention

In the second embodiment of the present invention, a silicon ingot is pulled up from a silicon melt based on the Voronkov theory, similarly to the first embodiment. As shown in FIG. 6, the predetermined pulling-up speed profile for the second embodiment of the present invention is determined such that the ratio (V/G) of a pulling-up speed to a temperature gradient is held at a value which is: equal to or greater than a second critical ratio ((V/G)$_2$) for avoiding occurrence of agglomerates of interstitial silicon point defects; and equal to or less than a third critical ratio ((V/G)$_3$) for restricting agglomerates of vacancy point defects within a center domain dominated by vacancy point defects; when the ingot is pulled up from a silicon melt within a hot zone furnace.

Figure 8:
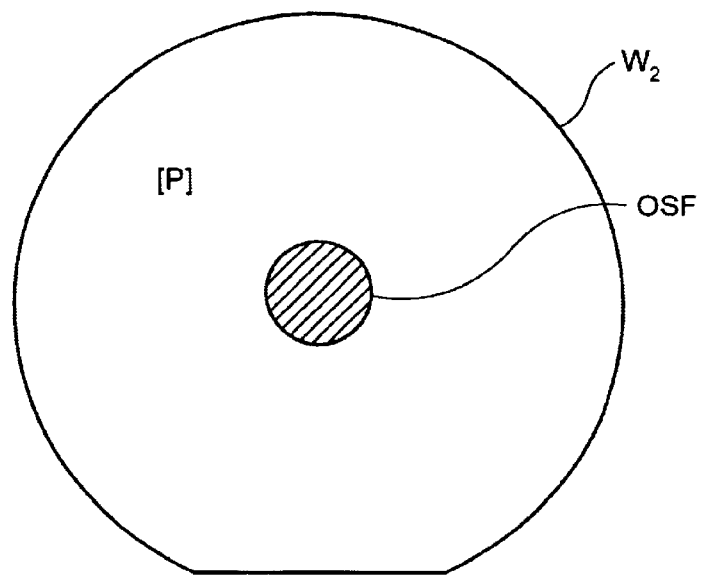
FIG. 8 is a plan view showing a situation where OSF's appear at the center of a silicon wafer $W_2$ according to the first embodiment of the present invention, corresponding to the position $P_2$ in FIG. 3.

As shown in FIG. 3, the second embodiment utilizes the wafer W$_2$ corresponding to the position P$_2$. This wafer W$_2$ includes a domain dominated by vacancy point defects, over a center area narrower than that of the wafer W$_2$. Unlike the ring shape OSF of the wafer W$_1$ (see FIG. 4), this smaller domain dominated by vacancy point defects and contacting with the perfect domain occurs only in a disk shape at the center of the wafer when it is heat treated in an atmosphere of oxygen at temperatures of 1,000° C.±30° C. for 2 to 5 hours and subsequently heat treated at temperatures of 1,130° C.±30° C. for 1 to 16 hours according to the conventional OSF actualization heat treatment. Namely, the silicon wafer used in this second embodiment of the present invention is fabricated by slicing an ingot grown at a pulling-up speed profile selectively determined such that the OSF actualizes only at the center of the wafer, unlike the ring shape OSF shown in FIG. 4. FIG. 8 is a plan view of the wafer. This silicon wafer W$_2$ is free of COP's, since OSF's are not formed in a ring shape. Further, no dislocation pits occur.

The silicon wafers fabricated by slicing the ingot pulled up under the above condition are heat treated by the following three characteristic methods.

(i) The silicon wafer W$_2$ is placed in a furnace kept at 800 to 900° C. in an atmosphere of 100% oxygen or in an atmosphere of mixed oxygen and nitrogen, temperature elevated at a rate of 5 to 10° C./minute, held at temperatures of 1,130° C. to 1,200° C. for 1 minute to 6 hours, and then temperature lowered at a rate of 4 to 2° C./minute. Inclusion of 20 to 95% of nitrogen is preferable for lowering the oxygen concentration near the wafer surface. This heat treatment method corresponds to claim 9.

(ii) The silicon wafer W$_2$ is placed in a furnace kept at 800 to 900° C. in an atmosphere of 100% argon, temperature elevated at a rate of 5 to 10° C./minute, held at temperatures of 1,130° C. to 1,200° C. for 1 minute to 6 hours, and then temperature lowered at a rate of 4 to 2° C./minute. This heat treatment method corresponds to claim 10.

(iii) The silicon wafer W$_3$ is placed in a furnace kept at 500 to 800° C. in an atmosphere of 100% oxygen or in an atmosphere of mixed hydrogen and argon, temperature elevated at a rate of 5 to 10° C./minute, held at temperatures of 1,150° C. to 1,250° C. for 1 minute to 4 hours, and then temperature lowered at a rate of 4 to 2° C./minute. The atmosphere of mixed hydrogen and argon is preferably argon rich. This heat treatment method corresponds to claim 11.

In any of the above methods (i) through (iii), oxygen precipitation nuclei existing within a wafer do not grow by the heat treatment at the predetermined temperature for the predetermined period of time, so that no OSF's occur even by the conventional OSF actualization heat treatment. The higher the heat treatment temperature in any of the methods, the higher the anneal effect. However, exceeding this uppermost limit leads to a possibility of contamination such as Fe from the heat treatment furnace. Particularly, exceeding 1,200° C. in the method (i) leads to a possibility of generation of a nitride film at the wafer surface or generation of nitrides due to diffusion of nitrogen into the wafer. Further, heat treatment temperatures lower than the lowermost limit leads to a poor anneal effect so that oxygen precipitation nuclei grow. Heat treatment in an atmosphere of argon or hydrogen such as in the methods (ii) and (iii) leads to a lower oxygen concentration at the wafer surface as compared with the method (i) by the atmosphere of oxygen, resulting in more difficult occurrence of OSF's upon conducting the conventional OSF actualization heat treatment, as compared with the method (i).

[C] Third Embodiment of the PresentInvention

Figure 9:
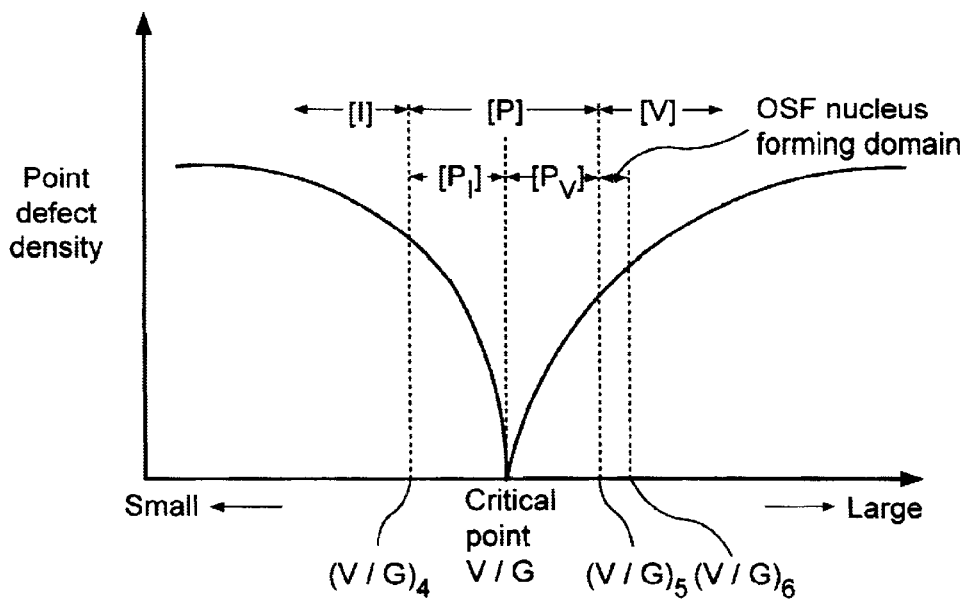
FIG. 9 is a view showing a relationship between a V/G ratio and a vacancy point defect density or an interstitial silicon point defect density in third through fifth embodiments of the present invention, based on the Voronkov theory.

In the third embodiment of the present invention, a silicon ingot is pulled up from a silicon melt based on the Voronkov theory, similarly to the first embodiment. As shown in FIG. 9, the mark [I] represents a domain (a fourth critical ratio $(V/G)_4$ or less) dominated by interstitial silicon point defects and including interstitial silicon point defects, the mark [V] represents a domain (a fifth critical ratio $\Box iV/G)_5$ or greater) dominated by vacancy point defects and including agglomerates of vacancy point defects within an ingot, and the mark [P] represents a perfect domain ($(V/G)_4$ to $(V/G)_5$) including no agglomerates of vacancy point defects and agglomerates of interstitial silicon point defects. The domain [V] neighboring with the domain [P] includes a domain [OSF] ($(V/G)_5$ to $(V/G)_6$) for forming OSF nuclei.

The perfect domain [P] is further classified into a domain $[P_I]$ and a domain $[P_V]$ The domain $[P_I]$ has the V/G ratio from the $(V/G)_4$ to the critical point, and the domain $[P_V]$ has the V/G ratio from the critical point to the $(V/G)_5$. Namely, the domain $[P_I]$ neighbors with the domain [I] and has an interstitial silicon point defect density lower than the lowest interstitial silicon point defect density capable of forming interstitial dislocations, and the domain $[P_V]$ neighbors with the domain [V] and has a vacancy point defect density lower than the lowest vacancy point defect density capable of forming OSF'S.

The predetermined pulling-up speed profile of the third embodiment is determined such that the ratio (V/G) of a pulling-up speed to a temperature gradient is kept between the fifth critical ratio ($(V/G)_5$) corresponding to the domain [OSF] for forming OSF nuclei and a sixth critical ratio ($(V/G)_6$), when the ingot is pulled up from a silicon melt within a hot zone furnace. This embodiment corresponds to claim 12.

Figure 10:
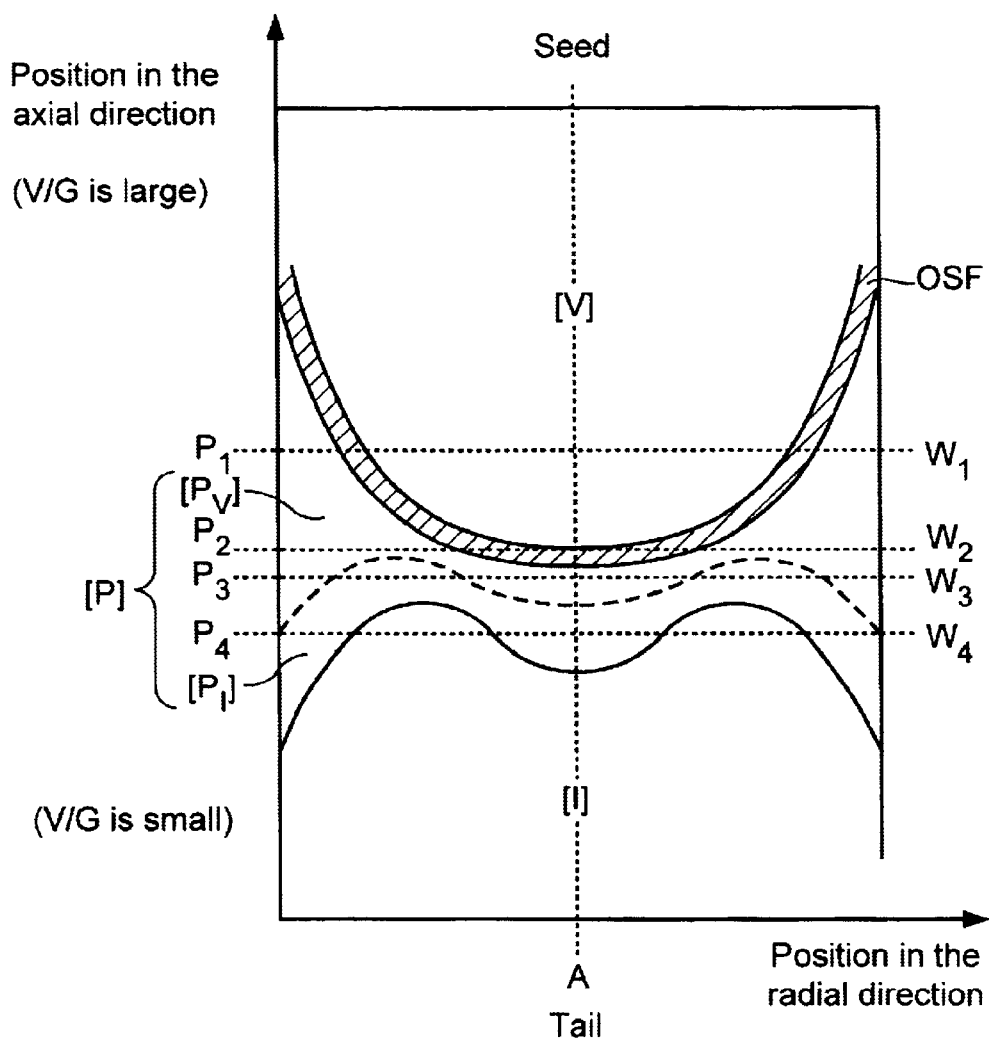
FIG. 10 is a schematic view of an X-ray tomographic image showing a vacancy point defect dominant domain, an interstitial silicon point defect dominant domain, and a perfect domain of a reference ingot according to the third through fifth embodiments of the present invention.

Similarly to FIG. 3, FIG. 10 is a cross-sectional view of an ingot where the pulling-up speed is gradually lowered to thereby continuously lower the ratio (V/G). In FIG. 10, the mark [V] represents a domain dominated by vacancy point defects within an ingot, the mark [I] represents a domain dominated by interstitial silicon point defects, and the mark [P] represents a perfect domain including no agglomerates of vacancy point defects and no agglomerates of interstitial silicon point defects. As described above, the perfect domain [P] is further classified into a domain $[P_I]$ and a domain $[P_V]$ The domain $[P_V]$ includes vacancy point defects not progressed into agglomerates within the perfect domain [P], and the domain $[P_I]$ includes interstitial silicon point defects not progressed into agglomerates within the perfect domain [P].

The wafer according to the third embodiment of the present invention is a wafer $W_2$ corresponding to the position $P_2$ in FIG. 10, similarly to the second embodiment. In the third embodiment, the wafer $W_2$ includes a center domain dominated by vacancy point defects over half (50% of) the entire area of the wafer, compared with the wafer $W_1$. Conducting the aforementioned OSF actualization heat treatment to this wafer $W_2$ results in occurrence of OSF's not in a ring shape but in a disk shape at the center of the wafer. In the wafer $W_1$ shown in FIG. 11, an OSF ring occurs near the edge of the wafer. In the wafer $W_2$ according to the third embodiment, OSF's occurs in an area wider than 25% of the entire area of the wafer. OSF's less than 25% of the entire area of the wafer lead to a narrower generation area of BMD's, resulting in difficulty in exhibiting a sufficient IG effect. Preferably, OSF's are from 50 to 80% of the entire area of the wafer. This wafer $W_2$ is fabricated by slicing an ingot grown by a pulling-up speed profile selectively determined such that OSF's actualizes not in a ring shape but over the center of the wafer as shown in FIG. 12. FIG. 13 is a plan view of the wafer $W_2$. This wafer $W_2$ is free of COP's, since OSF's do not form a ring shape. Further, no L/D's occur. The ingot for providing the wafer $W_2$ include oxygen precipitations without dislocation generation, at a rate of $2\times10^4$ to $2\times10^8$ pieces/cm$^2$. Thus, conducting the OSF actualization heat treatment for the wafer $W_2$ leads to occurrence of oxygen precipitations without dislocation generation at a density of $1\times10^5$ to $3\times10^7$ pieces/cm$^2$. Since such an ingot is used, it becomes unnecessary to introduce oxygen precipitation nuclei at a high density into a wafer by holding the wafer state at relatively lower temperatures of 500 to 800° C. for 0.5 to 20 hours before rapidly heating such as described in the Japanese Patent Application Laid-Open No. HEI-8-45945. BMD densities less than $2\times10^4$ pieces/cm$^2$ results in difficulty in exhibiting a sufficient IG effect upon rapid heating in a wafer state. Further, the value of $2\times10^8$ pieces/cm$^2$ is the maximum density of BMD's allowed to occur within the OSF domain.

The heat treatment method of the third embodiment is one-time rapid heating. This rapid heating is conducted in hydrogen gas or in an atmosphere including hydrogen gas. Concretely, the silicon wafer $W_2$ including oxygen precipitations without dislocation generation at the aforementioned percentage at a room temperature is swiftly placed in a furnace heated to temperatures of 1,100° C. to 1,250° C., and held for 1 minute to 2 hours. Another method is to arrange the silicon wafer $W_2$ including oxygen precipitations without dislocation generation at the aforementioned percentage at a room temperature in a fast heating furnace using a lamp capable of generating higher temperatures, to turn on a lamp switch to start heating to thereby rapidly heat up to temperatures of 1,100 to 1,250° C., and to hold the silicon wafer $W_2$. The term "rapidly heat" herein means to conduct a heat treatment at a temperature elevating speed between 3° C./minute to 150° C./second, preferably between 30° C./minute and 100° C./second. Rapidly heating the wafer by lamp light radiation enables uniform heating of the wafer, to thereby provide an advantage that the wafer warps lesser than a situation of introduction thereof into a pre-heated furnace.

Final temperatures lower than 1,100° C. reached by rapid heating lead to insufficient disappearance of oxygen precipitations near the wafer surface, thereby failing to ensure a sufficient DZ. Further, exceeding 1,250° C. leads to occurrence of dislocation before disappearance of oxygen precipitations near the wafer surface, thereby failing to ensure a sufficient DZ. Moreover, holding time less than 1 minute is too short to shrink oxygen precipitations near the wafer surface, resulting in insufficient disappearance of oxygen precipitations near the wafer surface and failing to ensure a sufficient DZ. Exceeding 2 hours leads to a DZ having an excessive thickness and to affection on productivity. Preferable holding time is determined to 1 minute to 1.5 hours.

Leaving the silicon wafer at a room temperature after the rapid heating leads to formation of a DZ over a depth of 1 to 100 µm from the wafer surface, to thereby provide a wafer having a BMD density of $2\times10^4$ to $2\times10^8$ pieces/cm$^3$ in a portion deeper than this DZ. This wafer exhibits a higher IG effect.

[D] Fourth Embodiment of the Present Invention

In the fourth embodiment the present invention, a silicon ingot is pulled up from a silicon melt based on the Voronkov theory, similarly to the first embodiment. The predetermined pulling-up speed profile of the fourth embodiment is determined such that the ratio (V/G) of a pulling-up speed to a temperature gradient is kept between the fourth critical ratio ((V/G)$_4$) for avoiding occurrence of agglomerates of interstitial silicon point defects and the fifth critical ratio ((V/G)$_5$) for restricting agglomerates of vacancy point defects to the ingot center domain dominated by vacancy point defects, when the ingot is pulled up from a silicon melt within a hot zone furnace. This embodiment corresponds to claim 14.

The wafer according to the fourth embodiment is the wafer W$_3$ corresponding to the position P$_3$ in FIG. 10, and the plan view thereof is shown in FIG. 14. The wafer W$_3$ is required to have its oxygen concentration of $0.8 \times 10^{18}$ to $1.4 \times 10^{18}$ atoms/cm$^3$ (old ASTM), so as to generate oxygen precipitation nuclei higher than a desired density by the following heat treatment. The wafer W$_3$ corresponding to the position P$_3$ includes an entirely perfect domain comprising mixed domain [P$_V$] and domain [P$_I$], since this wafer W$_3$ includes no agglomerates of vacancy point defects at the center and no agglomerates of interstitial silicon point defects at the edge as described above.

Heat treatments of the fourth embodiment includes a first step heat treatment and a second step heat treatment. The first step heat treatment is conducted by holding the wafer W$_3$ in an atmosphere of nitrogen, argon, hydrogen or oxygen or mixture thereof at temperatures of 600° C. to 850° C. for 120 to 250 minutes. Heating is preferably conducted by introducing the wafer at a rate of 50 to 100° C./minute into a heat treatment furnace held at 600 to 850° C. Holding temperatures lower than 600° C. or holding times shorter than 30 minutes lead to insufficient increase of oxygen precipitation nuclei, resulting in failure of a BMD density required to exhibit an IG effect upon conducting the next second step heat treatment. Holding temperatures exceeding 850° C. results in failure of a BMD density required to exhibit an IG effect upon conducting the next second step heat treatment, due to the lower density of oxygen precipitation nuclei of the domain [P$_1$]. Holding temperatures between 600° C. to 850° C. and holding time exceeding 90 minutes and shorter than 120 minutes leads to restriction of a precipitation amount of oxygen precipitation nuclei, due to excess of interstitial point defects accompanying to formation of oxygen precipitation nuclei. Holding time of 250 minutes or longer leads to reduced productivity.

The second step heat treatment is identical with the rapid heating in the third embodiment. Namely, this second step heat treatment is to rapidly heat the wafer in hydrogen gas or in an atmosphere including hydrogen gas from a room temperature up to temperatures of 1,100° C. to 1,250° C. at a temperature elevating speed of 3° C./minute to 100° C./second, and to hold the wafer for 1 minute to 2 hours.

Similarly to the second embodiment, leaving the silicon wafer at a room temperature after the rapid heating leads to formation of a DZ over a depth of 1 to 100 μm from the wafer surface, to thereby provide a wafer having a BMD density of $2 \times 10^4$ to $2 \times 10^8$ pieces/cm$^3$ in a portion deeper than this DZ. This wafer exhibits a higher IG effect.

[E] Fifth Embodiment of the Present Invention

The wafer according to the fifth embodiment is the wafer W$_3$ corresponding to the position P$_3$ in FIG. 10 identically with the fourth embodiment, and the plan view thereof is shown in FIG. 14. The fifth embodiment corresponds to claim 16.

The wafer W$_3$ is required to have its oxygen concentration of $0.8 \times 10^{18}$ to $1.4 \times 10^{18}$ atoms/cm$^3$ (old ASTM), so as to generate oxygen precipitation nuclei higher than a desired density by the following heat treatment. The wafer W$_3$ corresponding to the position P$_3$ includes an entirely perfect domain comprising the mixed domain [P$_V$] and domain [P$_I$], since this wafer W$_3$ includes no agglomerates of vacancy point defects at the center and no agglomerates of interstitial silicon point defects at the edge as described above.

Similarly to the fourth embodiment, the heat treatments of the fifth embodiment includes a first step heat treatment and a second step heat treatment. The first step heat treatment is rapid heating and is conducted by heating the wafer W$_3$ in an atmosphere of nitrogen, argon, hydrogen or oxygen or mixture thereof from a room temperature up to temperatures of 1,150° C. to 1,200° C. at a temperature elevating speed of 10° C./second to 150° C./second, and hold the wafer W$_3$ at temperatures of 1,150° C. to 1,200° C. for 0 to 30 seconds. Herein, a holding time of 0 second means that only temperature elevation is conducted, and holding is not conducted. Heating is conducted by introducing the wafer into a heat treatment furnace held at a room temperature or into the interior of a heat treatment furnace held at a temperature of several hundreds degrees by residual heat in case of a continuous operation, and temperature elevated to temperatures of 1,150° C. to 1,200° C. at a rate of 50° C./second to 100° C./second. Temperature elevating speeds slower than 10° C./second leads to increase of oxygen precipitation nuclei but results in a deteriorated and thus impractical processing ability. Holding temperatures lower than 1,150° C. leads to insufficient increase of oxygen precipitation nuclei, resulting in failure of a BMD density required to exhibit an IG effect upon conducting the next second step heat treatment. Holding temperatures exceeding 1,200° C. or holding time exceeding 30 seconds results in a problem such as occurrence of slip and deteriorated productivity of heat treatment. Temperature elevating speeds exceeding 150° C./second result in a problem of occurrence of slip due to dispersion of tare stress and in-plane temperature distribution.

The second step heat treatment is identical with the rapid heating in the third embodiment. Namely, this second step heat treatment is to rapidly heat the wafer in hydrogen gas or in an atmosphere including hydrogen gas from a room temperature up to temperatures of 1,100° C. to 1,250° C. at a temperature elevating speed of 3° C./minute to 100° C./second, and to hold the wafer for 1 minute to 2 hours.

Similarly to the third embodiment, leaving the silicon wafer at a room temperature after the rapid heating leads to formation of a DZ over a depth of 1 to 100 μm from the wafer surface, to thereby provide a wafer having a BMD density of $2 \times 10^4$ to $2 \times 10^8$ pieces/cm$^3$ in a portion deeper than this DZ.

[F] Sixth Embodiment of the Present Invention

Figure 15A:
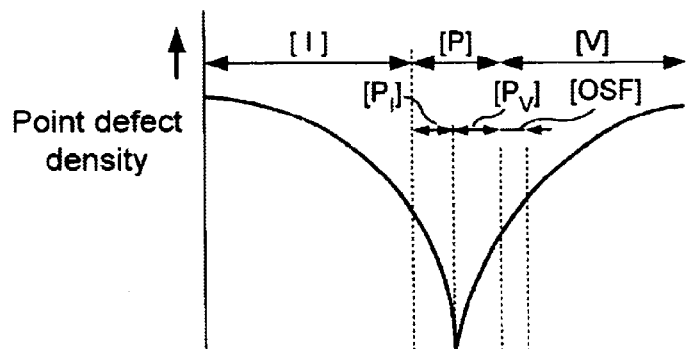
FIG. 15A is a view showing a relationship between a V/G ratio and a vacancy point defect density or an interstitial silicon point defect density in sixth and seventh embodiments of the present invention, based on the Voronkov theory.

In the sixth embodiment of the present invention, a silicon ingot is pulled up from a silicon melt based on the Voronkov theory, similarly to the first embodiment. FIG. 15A is identical with the above described FIG. 9. In FIG. 15A, the mark [I] represents a domain (a fourth critical ratio (V/G)$_4$ or less) dominated by interstitial silicon point defects and including interstitial silicon point defects, the mark [V] represents a domain (a fifth critical ratio □iV/G)$_5$ or greater) dominated by vacancy point defects and including agglomerates of vacancy point defects within an ingot, and the mark [P] represents a perfect domain ((V/G)$_4$ to (V/G)$_5$) including no agglomerates of vacancy point defects and agglomerates of interstitial silicon point defects. The domain [V] neighboring with the domain [P] includes a domain [OSF] ((V/G)$_5$ to (V/G)$_6$) for forming OSF nuclei. As described above, this perfect domain [P] is further classified into the domain [P$_I$] and the domain [P$_V$].

The predetermined pulling-up speed profile of the sixth embodiment is determined such that the ratio (V/G) of a pulling-up speed to a temperature gradient is kept between (V/G)$_4$ for avoiding occurrence of agglomerates of interstitial silicon point defects and (V/G)$_5$ for restricting agglomerates of vacancy point defects within the ingot center domain dominated by vacancy point defects, when the ingot is pulled up from a silicon melt within a hot zone furnace. This embodiment corresponds to claims 18 through 20. The predetermined pulling-up speed profile according to the invention of claim 19 is determined such that the V/G is between the critical point and (V/G)$_5$.

Figure 15B:
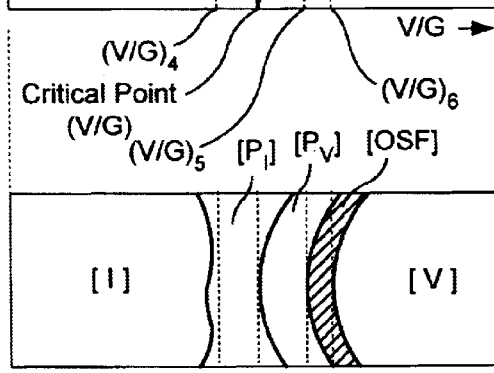
FIG. 15B is a conceptional view of an X-ray tomographic image of the ingot of the sixth and seventh embodiments after a heat treatment in an atmosphere of $N_2$ at 1,000° C. for 40 hours.
Figure 15C:
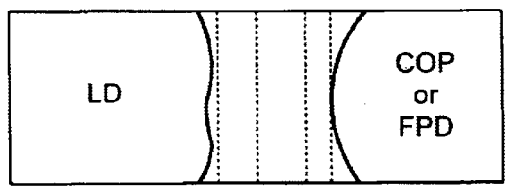
FIG. 15C is a defect distribution diagram of a crystal where the ingot of the sixth and seventh embodiments just after pulling up (as-grown state) is Secco etched.
Figure 15D:
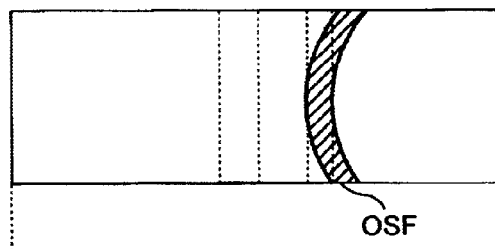
FIG. 15D is a defect distribution diagram of a crystal where the ingot of the sixth and seventh embodiments is heat treated in an atmosphere of humid $O_2$ and then Secco etched.
Figure 15E:
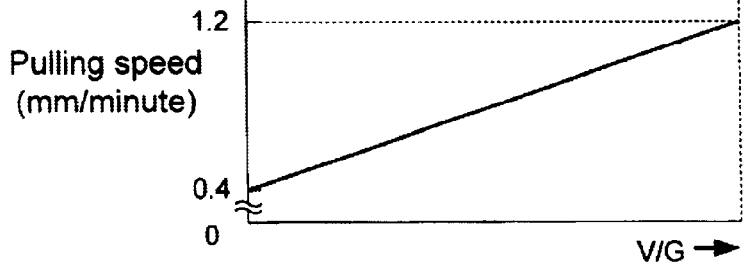
FIG. 15E is a view showing a transitional situation of a pulling-up speed of the ingot of the sixth and seventh embodiments.

As described above, this pulling-up speed profile is determined by a simulation based on the Voronkov theory, such as by empirically slicing a reference ingot in an axial direction, by empirically slicing a reference ingot into wafers, or by combining these techniques. FIG. 15E shows a situation where the pulling-up speed is gradually lowered from 1.2 mm/minute down to 0.4 mm/minute to thereby continuously lower the ratio (V/G). Cross-sectional views of ingots in this case are shown in FIG. 15B, FIG. 15C and FIG. 15D, respectively. The abscissae of the figures correspond to the abscissa (V/G) of FIG. 15A, respectively. FIG. 15B is a conceptional view by an X-ray tomographic image after a heat treatment of the ingot in an atmosphere of N$_2$ at 1,000° C. for 40 hour. In this figure, domain [V], domain [OSF], domain [P$_V$], domain [P$_I$] and domain [I] appear as the pulling-up speed is lowered. FIG. 15C is a defect distribution diagram of the crystal when the just pulled up ingot (in an as-grown state) is Secco etched for 30 minutes. In FIG. 15C, COP's and FPD's appear in the domain corresponding to the domain [V], and L/D's appear in the domain corresponding to the domain [I]. Further, FIG. 15D is a defect distribution diagram of the crystal when the ingot has been heat treated in an atmosphere of humid O$_2$ at 1,100° C. for 1 hour, and then Secco etched for 2 minutes. In this figure, OSF's appear.

FIG. 17A, FIG. 17B, FIG. 17C and FIG. 17D show silicon wafers W$_2$, W$_{311}$ W$_3$ and W$_{32}$ obtained by slicing the ingot in FIG. 16 corresponding to FIG. 15B at four positions, respectively. The wafer W$_2$ includes a center domain [OSF] forming OSF nuclei, and a domain [P$_V$] therearound. The wafer W$_{31}$ fully comprises the domain [P$_V$] The wafer W$_3$ includes a center domain [P$_V$] and a domain [P$_I$] therearound. The wafer W$_{32}$ fully comprises the domain [P$_I$].

The silicon wafer of the sixth embodiment is required to be anyone of the aforementioned wafers W$_{31}$, W$_3$ and W$_{32}$ shown in FIG. 17B, FIG. 17C and FIG. 17D, respectively, and has an initial oxygen concentration of 1.2×10$^{18}$ atoms/cm$^3$ (old ASTM) or more. Thus, the ingot to be sliced out to a silicon wafer has its oxygen concentration of 1.2×10$^{18}$ atoms/cm$^3$ (old ASTM) or more. This is to generate BMD's at a density greater than desired in the wafers W$_{31}$, W$_3$ and W$_{32}$ by the first step heat treatment, to thereby exhibit an IG effect.

(a) First Step Heat Treatment:

The first step heat treatment of the wafer W$_{31}$, W$_3$ or W$_{32}$ is conducted by heating the wafer in an atmosphere of a hydrogen gas or an argon gas from a room temperature up to temperatures of 900 to 1,200° C. at a temperature elevating speed of 5 to 50° C./minute, and holding the wafer for 5 to 120 minutes. Adoption of the nonoxidative atmosphere of hydrogen or argon gas for the heat treatment atmosphere is to render to shrink or disappear, near the wafer surface, those oxygen precipitation nuclei or OSF nuclei introduced upon crystal growth by an out diffusion effect of oxygens within the wafer, to thereby form a DZ (having a depth of about 1 to 5 μm) in the depth direction from the wafer surface.

Temperature elevating speeds exceeding 50° C./minute and holding temperatures lower than 900° C. or holding times shorter than 5 minutes lead to a lower out diffusion effect of oxygens so that oxygen precipitation nucleus or OSF nuclei introduced upon crystal growth do not shrink, thereby failing to form a sufficient DZ in the depth direction from the wafer surface. Further, there is not obtained a BMD density required to exhibit an IG effect within the wafer. Meanwhile, temperature elevating speeds slower than 5° C./minute and holding temperatures exceeding 1,200° C. lead to deterioration of thermal durability of the furnace and board materials, and deterioration of productivity of the heat treatment. The first step heat treatment is preferably to heat the wafer from a room temperature up to temperatures of 1,000 to 1,200° C. at a temperature elevating speed of 10 to 40° C./minute, and hold for 10 to 60 minutes.

(b) Second Step Heat Treatment:

The second step heat treatment is preferably conducted after the first step heat treatment, since the BMD density is increased and the IG effect is improved then.

The second step heat treatment of the wafer W$_{31}$ (claim 19) is conducted by introducing the wafer W$_{31}$ in a nitrogen atmosphere or an oxidative atmosphere from a room temperature into a furnace at temperatures of 500 to 800° C., heating the wafer up to temperatures of 750 to 1,100° C. at a temperature elevating speed of 10 to 50° C./minute, and holding the wafer for 4 to 48 hours. Adoption of a nitrogen atmosphere or oxidative atmosphere as the heat treatment atmosphere is to further increase the BMD density formed during the first step heat treatment. Temperature elevating speeds exceeding 50° C./minute and holding temperatures lower than 750° C. or holding times shorter than 4 hours lead to difficulty in sufficiently increase the BMD density. Meanwhile, temperature elevating speeds slower than 10° C./minute and holding temperatures exceeding 1,100° C. or holding times exceeding 48 hours result in deterioration of the productivity of the heat treatment. The second step heat treatment in this case is to preferably introduce the wafer from a room temperature into a furnace at temperatures of 600 to 800° C., to heat the wafer up to temperatures of 800 to 1,000° C. at a temperature elevating speed of 10 to 40° C./minute, and to hold the wafer for 6 to 40 hours.

The second step heat treatment of the wafer W$_3$ or W$_{32}$ (claim 20) is conducted by introducing the silicon wafer W$_3$ or W$_{32}$, after the first step heat treatment thereof, in a nitrogen atmosphere or an oxidative atmosphere from a room temperature into a furnace at temperatures of 400 to 700° C., to heat the wafer up to temperatures of 800 to 1,100° C. at a temperature elevating speed of 0.5 to 10° C./minute, and to hold the wafer for 0.5 to 40 hours. The reason of adopting the nitrogen atmosphere or oxidative atmosphere as the heat treatment atmosphere is identical with the above. Temperature elevating speeds exceeding 110° C./minute and holding temperatures lower than 800° C. or holding times shorter than 0.5 hours lead to difficulty in uniformly forming BMD's in a wafer surface. Meanwhile, temperature elevating speeds slower than 0.5° C./minute and holding temperatures exceeding 1,100° C. or holding times exceeding 40 hours lead to deteriorated productivity of the heat treatment. The second step heat treatment in this case is to preferably introduce the wafer from a room temperature into a furnace at temperatures of 300 to 600° C., to heat the wafer up to temperatures of 900 to 1,000° C. at a temperature elevating speed of 1 to 3° C./minute, and to hold the wafer for 1 to 12 hours.

Conducting the first step heat treatment eliminates an oxygen doner killing treatment of the wafer processes.

[G] Seventh Embodiment of the Present Invention

In the seventh embodiment of the present invention, a silicon ingot is pulled up from a silicon melt based on the Voronkov theory, similarly to the first embodiment. The predetermined pulling-up speed profile of the seventh embodiment is determined such that the ratio (V/G) of a pulling-up speed to a temperature gradient in FIG. 15A is kept between the critical point V/G and $(V/G)_6$, when the ingot is pulled up from a silicon melt within a hot zone furnace. This embodiment corresponds to claims 18 and 22.

The silicon wafer of the seventh embodiment is the wafer $W_2$ shown in FIG. 17A, and is required to have an initial oxygen concentration greater than $1.2 \times 10^{18}$ atoms/cm$^3$ (old ASTM). Thus, the ingot before sliced out into a silicon wafer has its oxygen concentration greater than $1.2 \times 10^{18}$ atoms/cm$^3$ (old ASTM). This is to generate BMD's at a density greater than desired in the wafer $W_2$ by the first step heat treatment, to thereby exhibit an IG effect.

The first step heat treatment and second step heat treatment of this silicon wafer are identical with those step heat treatments for the wafer $W_3$, $W_{31}$ or $W_{32}$ (claims 18 or 19) described in the sixth embodiment, so that the repetitive explanation of these treatments is omitted.

EXAMPLES

There will be described hereinafter examples of the present invention together with comparative examples.

Example 1

An ingot was pulled up to grow the domain corresponding to the position $P_0$ shown in FIG. 3, so that V/Ga and V/Gb become about 0.27 mm$^2$/minute ° C., respectively, where Ga is an axial temperature gradient at the center of the ingot and Gb is an axial temperature gradient at the edge of the ingot. To control the oxygen concentration within the ingot at this time, the flow rate of argon was kept at about 110 liter/minute, the rotational speed of a quartz crucible for storing the silicon melt was kept at about 5 to 10 rpm, and the pressure within the hot zone furnace was kept at about 60 Torr.

Silicon wafers sliced out from the thus pulled up ingot were lapped, chamfered and then mirror-polished, to thereby prepare silicon wafers each having a diameter of 8 inches and a thickness of 740 μm. Five pieces of the prepared silicon wafers were used for measurement of the number of COP's, and other five pieces were used for measurement of oxygen concentrations within the wafers.

Example 2

Silicon wafers obtained in the same manner with the example 1 were used to check whether OSF's actualize or not. Other five pieces of silicon wafers were heat treated in an atmosphere of 100% hydrogen at a temperature of 1,130° C. for 90 minutes.

By a laser particle counter (SFS6200 manufactured by KLA-Tencor, Inc.), there was counted the number of COP's of 0.12 μm or greater within a circle of a diameter of 200 mm on the silicon wafer surface of each of the five according to the example 1. Further, by the same laser particle counter, there was counted the number of COP's smaller than 0.12 μm within the circle of a diameter of 200 mm on the silicon wafer surface of each of the same five silicon wafers, based on the aforementioned "Method for Detecting Micro Pits in a Silicon Wafer" of Japanese Patent No. 2,520,316.

For comparison, there was prepared a comparative example 1 from a silicon wafer which included COP's of a size smaller than 0.12 μm at a density of 5 pieces/cm$^2$ and COP's greater than 0.12 μm at a density of 1 pieces/cm$^2$ when measured by the same laser particle counter. This silicon wafer of the comparative example 1 was heat treated under the same condition with the example 2, to thereby prepare a comparative example 2.

By a secondary ion mass spectrometry (SIMS), there were measured oxygen concentrations at a depth of 5 μm from the wafer surface of each of other five pieces of silicon wafers of the example 1 and of comparative example 1. Averaged values thereof are shown in Table 1, respectively.

The silicon wafers of the example 2 and comparative example 2 were heat treated at 1,000° C. for 2 hours by a pyrogenic oxidization method, and subsequently heat treated at 1,100° C. for 12 hours, so as to check whether OSF's actualize. By the laser particle counter (SFS6200 manufactured by KLA-Tencor, Inc.), there was counted the number of COP's of 0.12 μm or greater within a circle of a diameter of 200 mm on the silicon wafer surface of each of the remaining five pieces of silicon wafers. Further, by the same laser particle counter, there was counted the number of COP's smaller than 0.12 μm within the circle of a diameter of 200 mm on the silicon wafer surface of each of the same five silicon wafers, based on the aforementioned "Method for Detecting Micro Pits in a Silicon Wafer" of Japanese Patent No. 2,520,316. Averaged values thereof are shown in Table 1, respectively.

TABLE 1

| | Number of COPs (pieces/cm$^2$) | | | | | |
| --- | --- | --- | --- | --- | --- | --- |
| | Before Hydrogen Heat Treatment | | After Hydrogen Heat Treatment | | Density of oxygen: × 10$^{18}$ | |
| | <0.12 μm | ≧0.12 μm | <0.12 μm | ≧0.12 μm | (atoms/cm$^3$) (old ASTM) | Existence of OSF |
| Example 1 | 6.5 | 0.35 | — | — | 1.32 | — |
| Example 2 | — | — | 0 | 0 | — | No |
| Comparative Example 1 | 5 | 1 | — | — | 1.34 | — |
| Comparative Example 2 | — | — | 2 | 0.5 | — | Yes |

As apparent from Table 1, the number of COP's smaller than 0.12 μm was 5 pieces/cm$^2$ in the silicon wafer of the comparative example 1, and averagedly 6.5 pieces/cm$^2$ in the silicon wafer of the example 1. Further, the number of COP's of 0.12 μm or greater was 1 piece/cm$^2$ in the silicon wafer of the comparative example 1, and averagedly as less as 0.35 pieces/cm$^2$ in the silicon wafer of the example 1. Each of the silicon wafers of the example 1 and comparative example 1 had an oxygen concentration of about $1.3 \times 10^{18}$ atoms/cm$^3$, and was suitable as an IG wafer.

In the silicon wafer of the comparative example 2, OSF's actualized, the number of COP's smaller than 0.12 μm was averagedly 2 pieces/cm$^2$, and the number of COP's of 0.12 μm or greater was averagedly 0.5 pieces/cm$^2$. Contrary, in the silicon wafer of the example 2, OSF's did not actualize, COP's of 0.12 μm or greater were not detected of course, nor were COP's smaller than 0.12 μm, i.e., zero.

Namely, COP's smaller than 0.12 μm existed in the wafer of the comparative example 1 did not disappear in the wafer of the comparative example 2 heat treated in an atmosphere of hydrogen. This would be because those COP's in the wafer of the comparative example 1 were greater than COP's of the wafer of the example 1, and thus did not fully disappear at temperatures on the order of 1,130° C.

Example 3

Silicon wafers obtained identically with the example 1 were heat treated in an atmosphere of 100% hydrogen for 90 minutes, at temperatures of 1,050° C., 1,100° C., 1,150° C., 1,200° C. and 1,220° C., respectively. Time zero dielectric breakdown (TZDB) was measured for each of the thus heat treated wafers. In this measurement, there was tested a yield of each wafer, by forming an oxide film of a thickness of 9 nm on the wafer surface, forming an electrode thereon, and applying a voltage stress of 10 MV/cm to the wafer. The result is shown in FIG. 18.

Comparative Example 3

Five pieces of silicon wafers obtained identically with the comparative example 1 were heat treated in an atmosphere of 100% hydrogen for 90 minutes, at temperatures of 1,050° C., 1,100° C., 1,150° C., 1,200° C. and 1,220° C., respectively. Time zero dielectric breakdown (TZDB) was measured for each of the thus heat treated wafers, similarly to the example 3, and there was tested a yield of each wafer. The result is also shown in FIG. 18.

Figure 18:
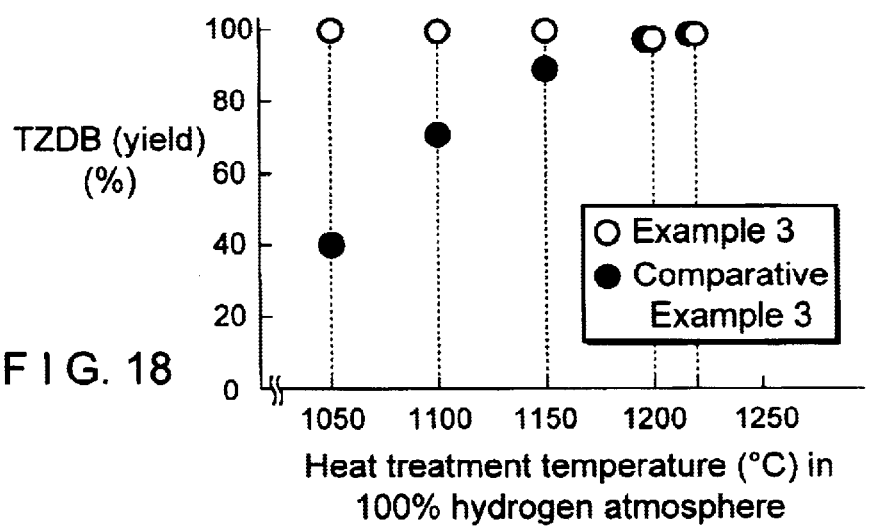
FIG. 18 is a view showing a relationship between a heat treatment temperature in an atmosphere of hydrogen and a time zero dielectric breakdown (TZDB) in an example 3 and a comparative example 3.

As apparent from FIG. 18, the yield of the example 3 was substantially 100% throughout temperatures from 1,050° C. to 1,220° C., whereas the yield exceeded 90% narrowly at 1,150° C. in the comparative example 3.

Example 4

Five pieces of silicon wafers obtained identically with the example 1 were heat treated in an atmosphere of 100% hydrogen at a temperature of 1,130° C. for 90 minutes. There was formed an oxide film of a thickness of 500 nm on each wafer surface, similarly to a heat treatment in a semiconductor device process. This oxide film was removed by hydrofluoric acid, and an oxide film of a thickness of 9 nm was again formed on the wafer surface from which the previous oxide film was removed, so as to conduct a measurement of time zero dielectric breakdown (TZDB) similarly to the example 3 to thereby test a yield of each wafer. The result thereof is shown in FIG. 19.

Comparative Example 4

Each of five pieces of silicon wafers obtained identically with the comparative example 1 were subjected to heat treatment, oxide film formation, oxide film removal, and oxide film re-formation, under the same condition with the example 4. Then, time zero dielectric breakdown (TZDB) similar to the example 3 was measured, and yields of the wafers were tested, respectively. The result thereof is shown in FIG. 19.

Figure 19:
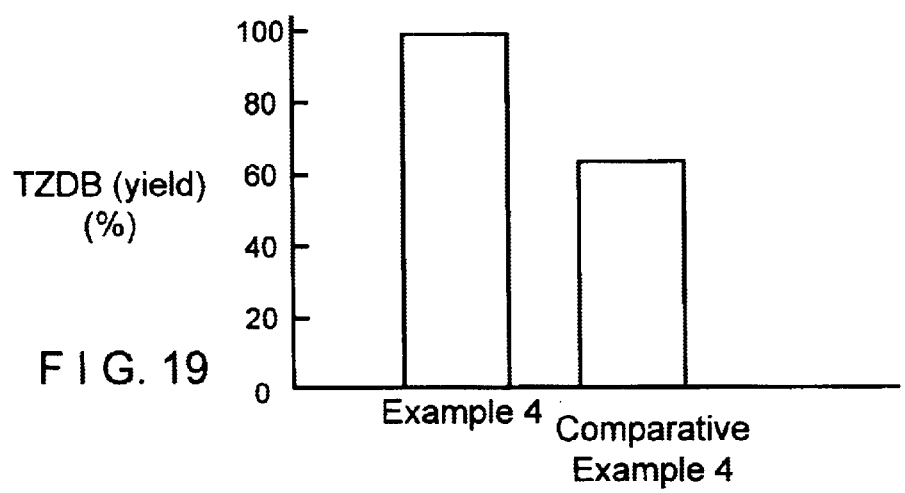
FIG. 19 is a view showing a relationship of a time zero dielectric breakdown (TZDB) of an example 4 and a comparative example 4.

As apparent from FIG. 19, the yield of the example 4 was substantially 100%, whereas the yield of the comparative example 4 was on the order of 60%. This proved that the wafer of the example 4 after the hydrogen heat treatment did not include agglomerates of vacancy point defects at least up to a depth of 0.5 μm from the wafer surface.

Example 5

A silicon wafer obtained identically with the example 1 was heat treated in an atmosphere of 100% hydrogen at a temperature of 1,130° C. for 90 minutes. This wafer was repeatedly cleaned by an SC-1 cleaning liquid ($NH_4OH:H_2O_2:H_2O=1:1:5$), to stepwise etch the wafer in the depth direction from the wafer surface, by 0.1 μm, 0.2 μm, 0.3 μm, 0.4 μm, and 0.5 μm. At respective steps, the number of COP's in the wafer surface was tested by a laser particle counter (SFS6200 manufactured by KLA-Tencor, Inc.). The result thereof is shown in FIG. 20.

Comparative Example 5

A silicon wafer obtained similarly to the comparative example 1 was heat treated under the same condition with the example 5, and repeatedly cleaned by an SC-1 cleaning liquid, and etched stepwise. COP's of the wafer was measured by the same particle counter with the example 5. The result is shown in FIG. 20.

Figure 20:
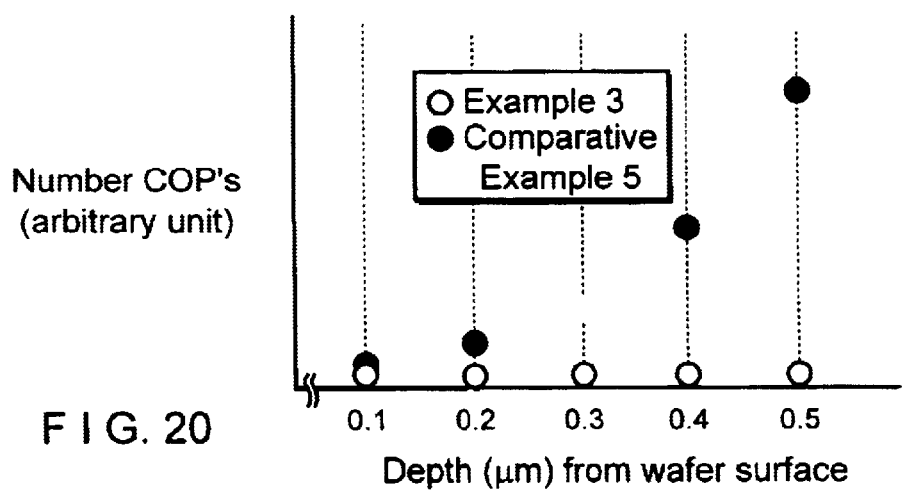
FIG. 20 is a view showing a transitional situation of COP's appearing at a wafer surface by repeated SC-1 cleaning, in an example 5 and a comparative example 5.

As apparent from FIG. 20, the silicon wafer of the example 5 was constantly free of COP's, whereas the number of COP's of the silicon wafer of the comparative example 5 increased as the depth from the wafer surface increased.

Example 6 and Example 7

An ingot was pulled up so as to grow the domain corresponding to the position $P_2$ shown in FIG. 3, throughout the whole length of the ingot. Silicon wafers sliced out from the thus pulled up ingot were lapped, chamfered and mirror-polished, to become prepared.

In a mixed atmosphere of 80% nitrogen and 20% oxygen, the above prepared silicon wafer was placed into a furnace kept at 800° C., temperature elevated at a speed of 10° C./minute, kept at a temperature of 1,200° C. for 2 hours, and then temperature lowered at a speed of 3° C./minute (example 6). Further, another of the above prepared silicon wafer was heat treated similarly to the example 6, except that the keeping temperature was set at 1,150° C. (example 7).

Comparative Examples 6 Through 8

Another of the above prepared silicon wafer was heat treated similarly to the example 6 (comparative example 6), except that it was conducted in a mixed atmosphere of 80% nitrogen and 20% oxygen at a keeping temperature of 1,100° C. Yet another of the above prepared silicon wafer was heat treated similarly to the example 6 (comparative example 7), except that it was conducted in a mixed atmosphere of 80% nitrogen and 20% oxygen at a keeping temperature of 1,000° C. Still another of the above prepared silicon wafer was not heat treated (comparative example 8).

Example 8 and Example 9

In an atmosphere of 100% argon, another of the above prepared silicon wafer was introduced into a furnace kept at 800° C., temperature elevated at a speed of 10° C./minute, kept at a temperature of 1,200° C. for 2 hours, and then temperature lowered at a speed of 3° C./minute (example 8). Yet another of the above prepared silicon wafer was heat treated similarly to the example 8 except that it was conducted in an atmosphere of 100% argon at a keeping temperature of 1,150° C. (example 9).

Comparative Example 9 and Comparative Example 10

Another of the above prepared silicon wafer was heat treated similarly to the example 8, except that it was conducted in an atmosphere of 100% argon at a keeping temperature of 1,100° C. (comparative example 9). Yet another of the above prepared silicon wafer was heat treated similarly to the example 8, except that it was conducted in an atmosphere of 100% argon at a keeping temperature of 1,000° C. (comparative example 10).

Example 10 and Example 11

In an atmosphere of 100% hydrogen, another of the above prepared silicon wafer was introduced into a furnace kept at 700° C., temperature elevated at a speed of 10° C./minute, kept at a temperature of 1,200° C. for 2 hours, and then temperature lowered at a speed of 3° C./minute (example 10). Yet another of the above prepared silicon wafer was heat treated similarly to the example 10 except that it was conducted in an atmosphere of 100% hydrogen at a keeping temperature of 1,150° C. (example 11).

Comparative Example 11 and Comparative Example 12

Another of the above prepared silicon wafer was heat treated similarly to the example 10, except that it was conducted in an atmosphere of 100% hydrogen at a keeping temperature of 1,100° C. (comparative example 10). Yet another of the above prepared silicon wafer was heat treated similarly to the example 10, except that it was conducted in an atmosphere of 100% hydrogen at a keeping temperature of 1,000° C. (comparative example 12).

Example 12 and Example 13

In an atmosphere of 100% oxygen, another of the above prepared silicon wafer was introduced into a furnace kept at 800° C., temperature elevated at a speed of 10° C./minute, kept at a temperature of 1,200° C. for 2 hours, and then temperature lowered at a speed of 3° C./minute (example 12). Yet another of the above prepared silicon wafer was heat treated similarly to the example 10 except that it was conducted in an atmosphere of 100% oxygen at a keeping temperature of 1,150° C. (example 13).

Comparative Example 13 and Comparative Example 14

Another of the above prepared silicon wafer was heat treated similarly to the example 12, except that it was conducted in an atmosphere of 100% oxygen at a keeping temperature of 1,100° C. (comparative example 13). Yet another of the above prepared silicon wafer was heat treated similarly to the example 12, except that it was conducted in an atmosphere of 100% oxygen at a keeping temperature of 1,000° C. (comparative example 14).

Comparative Evaluation 1

Figure 21:
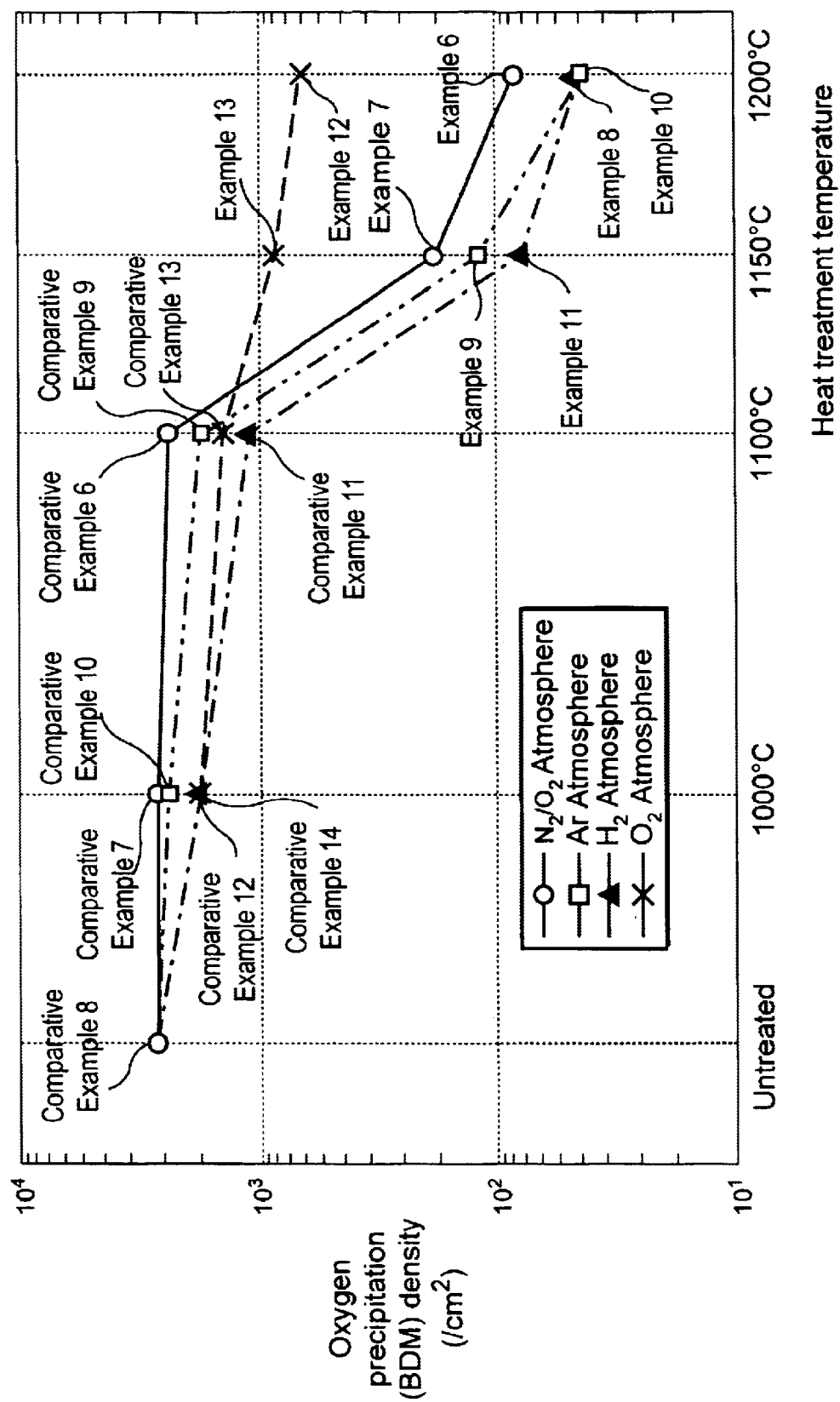
FIG. 21 is a view showing a concentration of oxygen precipitations of examples 6 through 13 and comparative examples 6 through 14 when OSF-actualizing heat treatments are applied thereto.

Silicon wafers heat treated in the examples 6 through 13 and comparative examples 6 through 14 were pyrogenically oxidized. Namely, the wafers were heat treated at a temperature of 1,000° C. for 4 hours and subsequently heat treated at a temperature of 1,130° C. for 3 hours, and then the oxygen precipitation density at the center of each wafer was measured by an optical microscope. The result thereof is shown in FIG. 21. It was further checked by eye whether OSF's actualized.

As shown in FIG. 21, when the conventional OSF actualization treatment was conducted for each of the silicon wafers of the comparative examples 6 through 14, the oxygen precipitation density exceeded $1 \times 10^3/cm^3$ so that whitened OSF's appeared in the center of the wafer. Contrary, even when the conventional OSF actualization treatment was conducted for each of the silicon wafers of the examples 6 through 13, the oxygen precipitation density was less than $1 \times 10^3/cm^3$ so that no OSF's appeared. Particularly, oxygen precipitation densities of examples 6 through 11 treated in a mixed atmosphere of oxygen and nitrogen, in an argon atmosphere or in a 100% hydrogen atmosphere were about $1 \times 10^2/cm^3$, i.e., smaller by about one digit as compared with those of the examples 12 and 13 heat treated in an atmosphere of 100% oxygen.

Example 14

Boron (B) doped p-type silicon ingots each having a diameter of 8 inches were pulled up by a single crystal of silicon pulling up apparatus. Each ingot had a straight body length of 1,200 mm, a crystal orientation of (100), a specific resistance of about 10 μm, and an oxygen concentration of $1.0 \times 10^{18}$ atoms/cm$^3$ (old ASTM). These ingots were two in number, and grown under the same condition while continuously decreasing the V/G upon pulling up from 0.24 mm$^2$/minute ° C. to 0.18 mm$^2$/minute ° C. One of the ingots was cut at its center in the pulling up direction as shown in FIG. 10 to check positions of respective domains, and the other ingot was sliced to provide, as a specimen, a silicon wafer $W_2$ corresponding to the position $P_2$ in FIG. 10. The wafer $W_2$ as the specimen in this example includes a center domain dominated by vacancy point defects by half (50% of) the entire area of the wafer. Conducting the OSF-actualizing heat treatment for the wafer $W_2$ resulted in occurrence of OSF's wider than 25% of the entire area of the wafer, as shown in FIG. 13, not in a ring shape but in a disk shape at the wafer center.

The wafer $W_2$ sliced out from the ingot and then mirror-polished was heat treated by heating the wafer in an atmosphere of 10% hydrogen gas and 90% argon gas from a room temperature up to 1,200° C. at a temperature elevating speed of approximately 50° C./minute, and then holding the wafer at 1,200° C. for 90 seconds.

Comparative Example 15

Boron (B) doped p-type silicon ingots each having a diameter of 8 inches were pulled up by the same apparatus with the example 14. Each ingot had a straight body length, a crystal orientation, a specific resistance, and an oxygen concentration, identical with those of the example 14, respectively. These ingots were two in number, and grown under the same condition by controlling the V/G identically with the example 14. One of the ingots was cut at its center in the pulling up direction as shown in FIG. 10 to check positions of respective domains, and the other ingot was sliced to provide, as a specimen, a silicon wafer $W_3$ corresponding to the position $P_3$ in FIG. 10. The wafer $W_3$ as the specimen in this comparative example did not include OSF's in a disk shape, since the OSF disk has decreased and disappeared upon the OSF-actualizing heat treatment, compared with the example 14. This wafer $W_3$ was heat treated identically with the example 14.

Comparative Evaluation 2

The wafers of the example 14 and comparative example 15 were cleaved, selectively etched at the wafer surface by a Wright etchant, and then measured by observation with an optical microscope concerning the surface BMD density in the domain portion at a depth of 350 μm from the wafer surface. The result thereof is shown in Table 2.

As apparent from Table 2, the wafer of the example 14 includes oxygen precipitations thicker than the comparative example 15, so that the wafer of the example 14 exhibits an IG effect higher than the wafer of the comparative example 15 when the OSF-actualizing heat treatment is conducted.

TABLE 2

| | Heat Treatment Condition | | | |
|---|---|---|---|---|
| | Temperature (° C.) | Time (second) | Atmosphere | BMD surface density (/cm²) |
| Example 14 | 1,200 | 90 | H₂ 10% + Ar 90% | 5.0 × 10⁵ to 1.0 × 10⁶ |
| Comparative Example 15 | 1,200 | 90 | H₂ 10% + Ar 90% | Less than 1.0 × 10⁴ |

Example 15

Boron doped p-type silicon ingots each having a diameter of 8 inches were pulled up identically with the example 14. Each ingot had a straight body length of 1,200 mm, a crystal orientation of (100), a specific resistance of about 10 μm, and an oxygen concentration of $1.0 \times 10^8$ atoms/cm³ (old ASTM). These ingots were two in number, and grown under the same condition while continuously decreasing the V/G upon pulling up from 0.24 mm²/minute ° C. to 0.18 mm²/minute ° C. One of the ingots was cut at its center in the pulling up direction as shown in FIG. 10 to check positions of respective domains, and the other ingot was sliced to provide, as a specimen, a silicon wafer $W_3$ corresponding to the position $P_3$ in FIG. 10. The wafer $W_3$ as the specimen in this example includes a center domain $[P_V]$, a domain $[P_I]$ therearound, and a further domain $[P_V]$ therearound, as shown in FIG. 14.

The wafer $W_3$ sliced out from the ingot and then mirror-polished was held at 700° C. for 120 minutes in a nitrogen atmosphere, to thereby conduct a first step heat treatment. Then, the wafer was heated in an atmosphere of 10% hydrogen gas and 90% argon gas from a room temperature up to 1,100° C. at a temperature elevating speed of about 50° C./minute, and held at 1,100° C. for 1 minute, to thereby conduct a second step heat treatment.

Example 16

The wafer $W_3$ was heat treated identically with the example 15, except that the second step heat treatment was conducted at 1,150° C. for 1 minute.

Example 17

The wafer $W_3$ was heat treated identically with the example 15, except that the second step heat treatment was conducted at 1,200° C. for 1 minute.

Example 18

The wafer $W_3$ was heat treated identically with the example 15, except that the second step heat treatment was conducted at 1,250° C. for 1 minute.

Comparative Evaluation 3

The wafers of the examples 14 through 18 were cleaved, and then surface BMD densities thereof were measured concerning the domain portion at a depth of 350 μm from the wafer surface, identically with the example 14 and the comparative example 15. The result thereof is shown in Table 3.

As apparent from Table 3, it has been shown that the dual step heat treatments of the examples 15 through 18 provide BMD densities required for IG effects of respective wafers.

TABLE 3

| | Heat Treatment Condition | | |
|---|---|---|---|
| | First Step Heat Treatment | Second Step Heat Treatment | BMD surface density (/cm²) |
| Example 15 | 700° C. × 120 minutes | 1,100° C. × 1 minute | 5.0 × 10⁵ |
| Example 16 | " | 1,150° C. × 1 minute | 1.0 × 10⁵ |
| Example 17 | " | 1,200° C. × 1 minute | 5.0 × 10⁵ |
| Example 18 | " | 1,250° C. × 1 minute | 1.0 × 10⁶ |

Example 19

Boron doped p-type silicon ingots each having a diameter of 8 inches were pulled up identically with the example 14. Each ingot had a straight body length of 1,200 mm, a crystal orientation of (100), a specific resistance of about 10 μm, and an oxygen concentration of $1.0 \times 10^{18}$ atoms/cm³ (old ASTM). These ingots were two in number, and grown under the same condition while continuously decreasing the V/G upon pulling up from 0.24 mm²/minute ° C. to 0.18 mm²/minute ° C. One of the ingots was cut at its center in the pulling up direction as shown in FIG. 10 to check positions of respective domains, and the other ingot was sliced to provide, as a specimen, a silicon wafer $W_3$ corresponding to the position $P_3$ in FIG. 10. The wafer $W_3$ as the specimen in this example includes a center domain $[P_V]$, a domain $[P_I]$ therearound, and a further domain $[P_V]$ therearound, as shown in FIG. 14.

The wafer $W_3$ sliced out from the ingot and then mirror-polished was heated in a nitrogen atmosphere from a room temperature up to 1,150° C. at a temperature elevating speed of about 50° C./second to thereby conduct a first step heat treatment, without holding the wafer at 1,150° C. Then, the wafer was heated in an atmosphere of 10% hydrogen gas and 90% argon gas from a room temperature up to 1,200° C. at a temperature elevating speed of about 50° C./minute, and held at 1,200° C. for 1 minute, to thereby conduct a second step heat treatment.

Example 20

The wafer $W_3$ was heat treated identically with the example 19, except that the first step heat treatment was conducted by holding the wafer for 30 seconds.

Example 21

The wafer $W_3$ was heat treated identically with the example 19, except that the first step heat treatment was conducted at 1,200° C., without holding the wafer.

Example 22

The wafer $W_3$ was heat treated identically with the example 21, except that the first step heat treatment was conducted by holding the wafer for 5 seconds.

Example 23

The wafer $W_3$ was heat treated identically with the example 21, except that the first step heat treatment was conducted by holding the wafer for 30 seconds.

Comparative Evaluation 4

The wafers of the examples 19 through 23 were cleaved, and then surface BMD densities thereof were measured concerning the domain portion at a depth of 350 μm from the wafer surface, identically with the example 14 and the comparative example 15. The result thereof is shown in Table 4.

As apparent from Table 4, it has been shown that the dual step heat treatments of the examples 19 through 23 provide BMD densities required for IG effects of respective wafers, and that higher BMD densities can be obtained in the examples 21 through 23 by the first step heat treatment at 1,200° C. or higher.

TABLE 4

| | Heat Treatment Condition | | |
|---|---|---|---|
| | First Step Heat Treatment | Second Step Heat Treatment | BMD surface density (/cm$^2$) |
| Example 19 | 1,150° C. × 0 second | 1,200° C. × 1 minute | 5.0 × 10$^5$ |
| Example 20 | 1,150° C. × 30 second | 1,200° C. × 1 minute | 1.0 × 10$^5$ |
| Example 21 | 1,200° C. × 0 second | 1,200° C. × 1 minute | 1.0 × 10$^6$ |
| Example 22 | 1,200° C. × 5 second | 1,200° C. × 1 minute | 8.0 × 10$^5$ |
| Example 23 | 1,200° C. × 30 second | 1,200° C. × 1 minute | 5.0 × 10$^5$ |

Example 24

Boron (B) doped p-type silicon ingots each having a diameter of 6 inches were pulled up by a single crystal of silicon pulling up apparatus. Each ingot had a straight body length of 600 mm, a crystal orientation of (100), a specific resistance of 1 to 15 Ωcm, and an oxygen concentration of 1.0×10$^{18}$ atoms/cm$^3$ (old ASTM). These ingots were two in number, and grown under the same condition while continuously decreasing the V/G upon pulling up from 0.24 mm$^2$/minute ° C. to 0.18 mm$^2$/minute ° C. one of the ingots was cut at its center in the pulling up direction as shown in FIG. 16 to check positions of respective domains, and the other ingot was sliced to provide, as specimens, silicon wafers corresponding to respective domains. The wafer $W_2$ as the specimen in this example includes a center domain [OSF] and a domain [$P_V$] therearound, as shown in FIG. 16 and FIG. 17A.

The wafer $W_2$ sliced out from the ingot and then mirror-polished was heat treated by heating the wafer in an atmosphere of hydrogen from a room temperature up to 1,200° C. at a temperature elevating speed of approximately 10° C./minute, and then holding the wafer for 60 minutes.

Example 25

The wafer $W_2$ sliced out from the same ingot with the example 24 and then mirror-polished was heated in a hydrogen atmosphere from a room temperature up to 1,200° C. at a temperature elevating speed of 10° C./second, and then held for 60 minutes to thereby conduct a first step heat treatment. Then, this wafer $W_2$ was introduced in a nitrogen atmosphere into a furnace at 800° C., heated to 1,000° C. at a temperature elevating speed of 10° C./minute, and then held for 24 hours, to thereby conduct a second step heat treatment.

Comparative Example 16

The wafer $W_2$ sliced out from the same ingot with the example 24 and mirror-polished was provided as a comparative example 16, without conducting a first step heat treatment nor second step heat treatment.

Comparative Example 17

The wafer $W_2$ sliced out from the same ingot with the example 24 and mirror-polished was provided as a comparative example 17, without conducting a first step heat treatment while conducting only the second step heat treatment of the example 25.

Comparative Evaluation 5

The wafers of the example 24 and comparative example 16 were heated in an atmosphere of humid oxygen at 1,200° C. for 60 minutes to thereby conduct the OSF actualization heat treatment, and then Secco etched for 2 minutes. As a result, the wafer of the example 24 was free of OSF's over the entire surface up to the depth of 20 μm from the wafer surface, whereas OSF's actualized at the wafer center in the comparative example 16, as shown in FIG. 22.

The wafers of the examples 24, 25 and comparative examples 16, 17 were cleaved, selectively etched at the wafer surface by a Wright etchant, and then measured by observation with an optical microscope concerning the volumetric BMD density of the entire wafer surface from the wafer center up to the wafer edge at a depth of 100 μm from the wafer surface. The results are shown in FIG. 23. Those figures at the right side of FIG. 23 have respective abscissae representing a distance from a wafer center (0 mm) up to a wafer edge (±75 mm) and respective ordinates representing a volumetric BMD density.

As apparent from FIG. 23, the volumetric BMD density of the wafer of the comparative example 16 was less than a detection lower limit (1×10$^6$ pieces/cm$^3$). In the wafer of the example 24, there was detected a volumetric BMD density of 2×1 pieces/cm$^3$ or more, preferably on the order of 10$^8$ pieces/cm$^3$, which is assumed to have an IG effect over the entire wafer surface. Further, a volumetric BMD density on the order of 10$^{10}$ pieces/cm$^3$ greater than the above by 2 digits is detected over the entire wafer surface in the example 25, thereby demonstrating that a higher IG effect can be obtained. Note, a volumetric BMD density on the order of 10$^{10}$ pieces/cm$^3$ was detected over the entire wafer surface in the wafer of the comparative example 17, but OSF's actualized when this wafer was treated in an oxidative atmosphere.

Further, measuring a depth of a DZ at the wafer surface of each of examples 24, 25 and comparative example 17 showed values of 5 μm, 5 μm, and 0.5 μm or less, respectively. Note, a DZ at the wafer surface of the example 16 was undetectable.

Example 26

A silicon wafer was sliced out from the ingot pulled up in the example 24, and provided as a specimen. The wafer as the specimen in this example is the wafer $W_3$ having a center domain [$P_V$] and a domain [$P_I$] therearound, as shown in FIG. 16 and FIG. 17C.

The wafer $W_3$ sliced out from the ingot and mirror-polished was heated in a hydrogen atmosphere from a room temperature up to 1,200° C. at a temperature elevating speed of 10° C./minute, and held for 60 minutes, to thereby conduct a first step heat treatment.

Example 27

The wafer $W_3$ sliced out from the same ingot with the example 24 and mirror-polished was heated in a hydrogen atmosphere from a room temperature up to 1,200° C. at a temperature elevating speed of 10° C./minute and held for 60 minutes to thereby conduct a first step heat treatment. Then, this wafer $W_3$ was introduced in a nitrogen atmosphere from a room temperature into a furnace at 800° C., heated up to 1,000° C. at a temperature elevating speed of 10° C./minute, and held for 24 hours, to thereby conduct a second step heat treatment.

Example 28

The wafer $W_3$ sliced out from the same ingot with the example 24 and mirror-polished was heated in a hydrogen atmosphere from a room temperature up to 1,200° C. at a temperature elevating speed of 10° C./minute and held for 60 minutes to thereby conduct a first step heat treatment. Then, this wafer $W_3$ was introduced in a nitrogen atmosphere from a room temperature into a furnace at 500° C., heated up to 1,000° C. at a temperature elevating speed of 1° C./minute, and held for 4 hours, to thereby conduct a second step heat treatment.

Comparative Example 18

The wafer $W_3$ sliced out from the same ingot with the example 24 and mirror-polished was provided as a comparative example 18, without conducting a first step heat treatment nor second step heat treatment.

Comparative Example 19

The wafer $W_3$ sliced out from the same ingot with the example 24 and mirror-polished was provided as a comparative example 19, without conducting a first step heat treatment while conducting only the second step heat treatment of the example 27.

Comparative Evaluation 6

Figure 24:
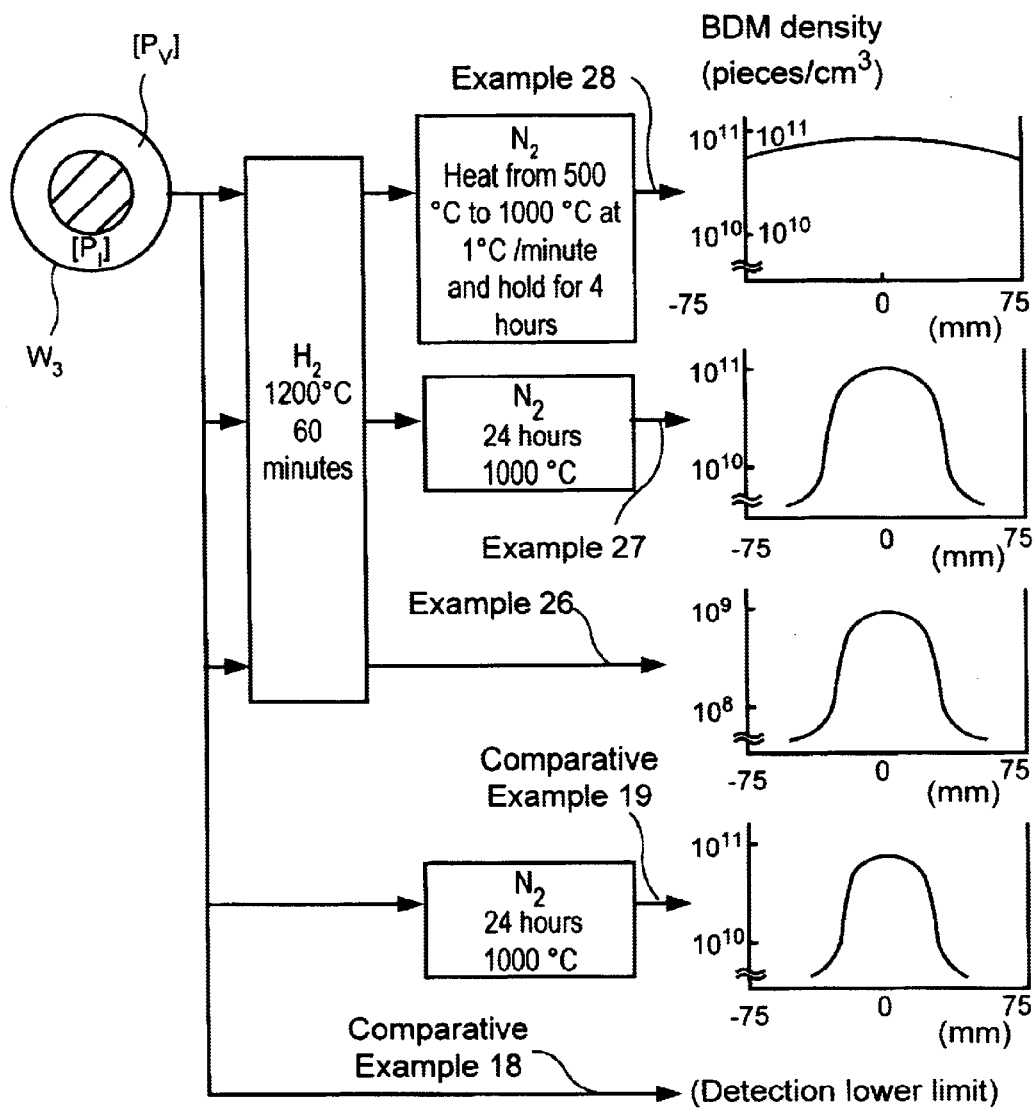
FIG. 24 is a view showing heat treatment methods of silicon wafers $W_3$ of examples 26, 27, 28 and comparative examples 18, 19 and a generation status of BMD's in the silicon wafers $W_3$.

The wafers of the examples 26, 27, 28 and comparative examples 18, 19 were measured concerning the volumetric BMD density of the entire wafer surface from the wafer center up to the wafer edge at a depth of 100 µm from the wafer surface, identically with the comparative evaluation 5. The results are shown in FIG. 24. Those figures at the right side of FIG. 24 have respective abscissae representing a distance from a wafer center (0 mm) up to a wafer edge (±75 mm) and respective ordinates representing a surface BMD density.

As apparent from FIG. 24, BMD's were not detected at all from the wafer of the comparative example 18. In the wafer of the example 26, the volumetric BMD density of the portion corresponding to the edge domain $[P_I]$ was $10^8$ pieces/cm$^3$ or less, whereas the volumetric BMD density of the portion corresponding to the center domain $[P_V]$ was about $10^9$ pieces/cm$^3$ which is supposed to have an IG effect. In the wafer of the example 27, BMD's larger than the value just above by 2 digits were detected at the edge and center of the wafer. In the wafer of the example 28, a volumetric BMD density of about $10^{11}$ pieces/cm$^3$ was detected over the entire wafer surface. This showed that the wafer center of the example 27 and the entire wafer surface of the example 28 had IG effects higher than that of the example 26. Note, the wafer of the comparative example 19 had a detected volumetric BMD density similar to that of the example 27, but the distribution of the BMD density in the comparative example 19 was inferior concerning uniformity in the radial direction of the wafer.

Measuring depths of DZ's in wafer surfaces of the examples 26, 27 and 28 showed 5 µm in all of them. Note, DZ's were undetectable in the wafer surface of the comparative example 18. The DZ of the comparative example 19 was 0.5 µm depth or less at the wafer center, and undetectable at the wafer edge.

Example 29

A silicon wafer was sliced out from the ingot pulled up in the example 24, and provided as a specimen. The wafer as the specimen in this example is the wafer $W_4$ having a full domain $[P_I]$ shown in FIG. 16 and FIG. 17D.

The wafer $W_4$ sliced out from the ingot and mirror-polished was heated in a hydrogen atmosphere from a room temperature up to 1,200° C. at a temperature elevating speed of 10° C./minute, and held for 60 minutes, to thereby conduct a first step heat treatment. Then, this wafer $W_4$ was introduced in a nitrogen atmosphere from a room temperature into a furnace at 800° C., heated up to 1,000° C. at a temperature elevating speed of 10° C./minute, and held for 24 hours, to thereby conduct a second step heat treatment.

Example 30

The wafer $W_4$ sliced out from the same ingot with the example 24 and mirror-polished was heated in a hydrogen atmosphere from a room temperature up to 1,200° C. at a temperature elevating speed of 10° C./minute and held for 60 minutes to thereby conduct a first step heat treatment. Then, this wafer $W_4$ was introduced in a nitrogen atmosphere from a room temperature into a furnace at 800° C., heated up to 1,000° C. at a temperature elevating speed of 10° C./minute, and held for 24 hours, to thereby conduct a second step heat treatment.

Example 31

The wafer $W_4$ sliced out from the same ingot with the example 24 and mirror-polished was heated in a hydrogen atmosphere from a room temperature up to 1,200° C. at a temperature elevating speed of 10° C./minute and held for 60 minutes to thereby conduct a first step heat treatment. Then, this wafer $W_4$ was introduced in a nitrogen atmosphere from a room temperature into a furnace at 500° C., heated up to 1,000° C. at a temperature elevating speed of 1° C./minute, and held for 4 hours, to thereby conduct a second step heat treatment.

Comparative Example 20

The wafer $W_4$ sliced out from the same ingot with the example 24 and mirror-polished was provided as a comparative example 20, without conducting a first step heat treatment nor second step heat treatment.

Comparative Example 21

The wafer $W_4$ sliced out from the same ingot with the example 24 and mirror-polished was provided as a comparative example 21, without conducting a first step heat treatment while conducting only the second step heat treatment of the example 29.

Comparative Example 22

The wafer $W_4$ sliced out from the same ingot with the example 24 and mirror-polished was provided as a comparative example 22, without conducting a first step heat treatment while conducting only the second step heat treatment of the example 30.

Comparative Evaluation 7

The wafers of the examples 29, 30 and comparative examples 20, 21, 22 were measured concerning the volumetric BMD density of the entire wafer surface from the wafer center up to the wafer edge at a depth of 100 µm from the wafer surface, identically with the comparative evaluation 5. The results are shown in FIG. 25. Those figures at the right side of FIG. 25 have respective abscissae representing a distance from a wafer center (0 mm) up to a wafer edge (±75 mm) and respective ordinates representing a surface BMD density.

As apparent from FIG. 25, BMD's were not detected at all from the wafers of the comparative examples 20 and 21. In the wafer of the example 29, the volumetric BMD density was $2 \times 10^7$ pieces/cm$^3$ over the entire wafer surface, which is supposed to have an IG effect. In the wafer of the example 30, BMD's on the order of $10^{10}$ pieces/cm$^3$ larger than the value just above by 3 digits were detected over the entire wafer surface, showing that a higher IG effect can be obtained. Note, a volumetric BMD density on the order of $10^9$ pieces/cm$^3$ was detected in the wafer of the comparative example 22, but OSF's actualized when the wafer was heat treated in an oxidative atmosphere.

Measuring depths of DZ's in wafer surfaces of the examples 29 and 30 showed 5 µm in both of them. Note, DZ's were undetectable in the wafer surface of the comparative examples 20 and 21. The DZ of the comparative example 22 was 0.5 µm depth or less at the wafer center, and undetectable at the wafer edge.

What is claimed is:

1. A heat treatment method of a silicon wafer for rendering said silicon wafer to exhibit an IG effect, in which said silicon wafer comprises a mixed domain of $[P_V]$ and $[P_I]$ and has an oxygen concentration of $0.8 \times 10^{18}$ to $1.4 \times 10^{18}$ atoms/cm$^3$ (old ASTM), where $[P_I]$ is a domain neighboring with a domain [I] dominated by interstitial silicon point defects, is classified into a perfect domain [P] including no agglomerates of point defects, and has a concentration of interstitial silicon lower than the lowest concentration of interstitial silicon capable of forming interstitial dislocations, and where $[P_V]$ is a domain neighboring with a domain [V] dominated by vacancy point defects, is classified into said perfect domain [P], and has a concentration of vacancies equal to or lower than a concentration of vacancies capable of forming COP's or FPD's, said method comprising the steps of:
      conducting a first step heat treatment for heating said silicon wafer in an atmosphere of nitrogen, hydrogen, oxygen, mixture of nitrogen and argon, mixture of hydrogen and argon or a mixture of oxygen and argon from a room temperature up to 1,150° C. to 1,200° C. at a temperature elevating speed of 10° C./second to 150° C./second, and for holding said silicon wafer at temperatures of 1,150° C. to 1,200° C. for 0 to 30 seconds; and
      subsequently conducting a second step heat treatment for rapidly heating said silicon wafer in a hydrogen gas or in an atmosphere including a hydrogen gas from a room temperature up to temperatures of 1,100° C. to 1,250° C. at a temperature elevating speed of 3° C./minute to 100° C./second, and for holding said silicon wafer for 1 minute to 2 hours.

* * * * *